(12) United States Patent
Bouten

(10) Patent No.: US 12,360,299 B2
(45) Date of Patent: Jul. 15, 2025

(54) METHOD, OPTICAL FILTER SYSTEM, OPTICAL MEASUREMENT DEVICE AND USE

(71) Applicant: ADMESY B.V., Ittervoort (NL)

(72) Inventor: Ruud Martin Jozef Bouten, Ittervoort (NL)

(73) Assignee: ADMESY B.V., Ittervoort (NL)

( * ) Notice: Subject to any disclaimer, the term of this patent is extended or adjusted under 35 U.S.C. 154(b) by 0 days.

(21) Appl. No.: 18/879,152

(22) PCT Filed: Jun. 28, 2023

(86) PCT No.: PCT/EP2023/067688
§ 371 (c)(1),
(2) Date: Dec. 26, 2024

(87) PCT Pub. No.: WO2024/003157
PCT Pub. Date: Jan. 4, 2024

(65) Prior Publication Data
US 2025/0164676 A1  May 22, 2025

(30) Foreign Application Priority Data

Jul. 1, 2022 (EP) ..................................... 22182476
Jul. 1, 2022 (EP) ..................................... 22182483

(51) Int. Cl.
*G02B 5/20* (2006.01)
*G01J 3/12* (2006.01)
(Continued)

(52) U.S. Cl.
CPC ................ *G02B 5/201* (2013.01); *G01J 3/12* (2013.01); *G01J 3/2803* (2013.01); *G01J 3/513* (2013.01);
(Continued)

(58) Field of Classification Search
CPC .. G02B 5/201; G02B 5/285; G01J 3/12; G01J 3/2803; G01J 3/513; G01J 2003/1217; G01J 2003/1221; G01J 2003/2806; H10F 39/026
See application file for complete search history.

(56) References Cited

U.S. PATENT DOCUMENTS

2002/0122261 A1   9/2002  Francis
2011/0228151 A1*  9/2011  Inomata ................ H10F 39/804
                                                              438/66
(Continued)

FOREIGN PATENT DOCUMENTS

WO       2021085367 A1    5/2021

OTHER PUBLICATIONS

International Search Report to Application No. PCT/EP2023/067688, mail Nov. 6, 2023 (24 pages).

(Continued)

*Primary Examiner* — Tarifur R Chowdhury
*Assistant Examiner* — Carlos Perez-Guzman
(74) *Attorney, Agent, or Firm* — NIXON PEABODY LLP; Jeffrey L. Costellia

(57) ABSTRACT

The invention is a method for manufacturing filters for an optical filter system, for manufacturing an optical filter system, and for manufacturing an optical measurement device. The system comprises a plurality of filters, and a frame holding the plurality of filters in a predefined pattern. The method comprises, per filter, the steps of:
 applying a plurality of coatings on a substrate to obtain a coated substrate provided with a stack of filter coatings designed for the specific spectral sensitivity of the filter, dividing the coated substrate into a plurality of portions, determining the good ones of the portions, which meet a predefined design requirement, (Continued)

dicing the coated substrate into the plurality of portions, and picking a good one of the portions as the filter.

16 Claims, 6 Drawing Sheets

(51) Int. Cl.
*G01J 3/28* (2006.01)
*G01J 3/51* (2006.01)
*G02B 5/28* (2006.01)
*H10F 39/00* (2025.01)

(52) U.S. Cl.
CPC ...... *G02B 5/285* (2013.01); *G01J 2003/1217* (2013.01); *G01J 2003/1221* (2013.01); *G01J 2003/2806* (2013.01); *H10F 39/026* (2025.01)

(56) References Cited

U.S. PATENT DOCUMENTS

| | | |
|---|---|---|
| 2017/0123121 A1 | 5/2017 | Downing et al. |
| 2018/0052266 A1 | 2/2018 | Mathai et al. |
| 2020/0300699 A1* | 9/2020 | Moggridge ........... G01J 3/0218 |
| 2022/0201172 A1 | 6/2022 | Kawanago et al. |
| 2022/0236463 A1 | 7/2022 | Kishine et al. |

OTHER PUBLICATIONS

European Search Report to Application No. 22182476.6, mail Jan. 18, 2023 (18 pages).

* cited by examiner

METHOD, OPTICAL FILTER SYSTEM, OPTICAL MEASUREMENT DEVICE AND USE

TECHNICAL FIELD

The invention relates to a method for manufacturing filters for an optical system, to a method for manufacturing an optical filter system, and to a method for manufacturing an optical measurement device comprising the optical filter system. The invention further relates to an optical filter system manufactured according to the method, and an optical measurement device comprising the optical filter system.

BACKGROUND

To measure color, various color measuring devices are known in the art, such as spectrometers and colorimeters. Spectrometers are typically designed to determine a spectrum of wavelengths that is irradiated or reflected by an object.

In a colorimeter, each of the sensors of the colorimeter has a sensor filter that allows passage of part of the light spectrum while blocking another part of the light spectrum. This allows each sensor to provide a signal representative of the respective range in the light spectrum. However, in addition to the sensor filters, the colorimeter has various optical components, some of which may filter part of the light propagating towards the sensors. To take into account the filtering by these optical components, the sensor filters are optimized to take this additional filtering into account. For example, a sensor filter is optimized to allow light with a certain wavelength to pass through with minimal reduction of the intensity of the light, in case the light with this wavelength is partly filtered by another optical component. For example, the sensor filter is optimized to reduce the intensity of light with another wavelength passing through, in case the light with this wavelength is not or not significantly filtered by another optical component. Because of this optimization of the sensor filters, such sensor filters are complex and expensive.

A spectrometer, also referred to as an optical spectrometer, is an instrument that is able to determine an intensity of light as a function of wavelength. Although a spectrometer is typically able to provide detailed information about wavelengths which are present in a ray of light, a spectrometer is typically expensive due to its complex optical design.

SUMMARY OF THE INVENTION

It is an objective of the invention to provide a solution to the problems of the known art, or at least to provide an alternative solution. Another objective of the invention is provide a method for producing i) filters for an optical filter system and/or ii) an optical filter system for an accurate optical measurement device against reduced costs.

One or more of these objectives are, according to a first aspect of the invention achieved by providing a method for manufacturing filters for an optical filter system, wherein the method comprises the steps of:
applying a plurality of filter coatings on a substrate to obtain a coated substrate provided with a stack of filter coatings, which stack is designed for the specific spectral sensitivity of the respective filter,
dividing the coated substrate into a plurality of substrate portions,
examining the coated substrate to determine the good ones of the substrate portions, the good ones being the substrate portions where the coated substrate meets a predefined design requirement associated to the specific spectral sensitivity-of the respective filter,
after having determined the good ones, dicing the coated substrate into the plurality of substrate portions, and creating a stock of the good ones of substrate portions.

According to a further embodiment of the first aspect, the optical filter system for which the filters are manufactured, may comprise:
  i) a plurality of filters, each having a specific spectral sensitivity, and
  ii) a filter frame holding the plurality of filters in a predefined pattern.

According to a further embodiment, the steps of the method according to the first aspect may be executed 'per said filter of a said spectral sensitivity'. In other words, the method according to the first aspect may comprise these steps 'per said filter of a said spectral sensitivity'.

Further one or more of the above objectives are, according to a sub-aspect of the first aspect, achieved by providing a method for manufacturing an optical filter system, wherein the optical filter system comprises: i) a plurality of filters, each having a specific spectral sensitivity, and ii) a filter frame holding the plurality of filters in a predefined pattern; and
wherein the method comprises:
  the steps of the first aspect, which steps are executed at one moment in time, and,
  executed at a later moment in time and per said filter of a said specific spectral sensitivity, step of picking a said good one of the substrate portions as the filter from a said stock comprising filters of the said spectral sensitivity; and
  a step of configuring the filters picked and the filter frame such that the filter frame holds the plurality of filters in the predefined pattern.

Further, one or more of the above objectives are, according to a second aspect of the invention, achieved by providing a method for manufacturing an optical filter system, wherein the optical filter system comprises:
  a plurality of filters, each filter having a specific spectral sensitivity, and
  a filter frame holding the plurality of filters in a predefined pattern;
wherein the method comprises providing a said filter frame (this step of providing being an optional step, which may be absent or in case present may take place at any time before or during the method of the second aspect);
wherein the method comprises, per said filter of a said specific spectral sensitivity, the steps of:
  applying a plurality of filter coatings-a plurality of layers of filter coating-on a substrate to obtain a coated substrate provided with a stack of filter coatings, which stack is designed for the specific spectral sensitivity of the respective filter,
  dividing the coated substrate into a plurality of substrate portions,
  examining the coated substrate to determine the good ones of the substrate portions, the good ones being the substrate portions where the coated substrate meets a predefined design requirement associated to the specific spectral sensitivity of the respective filter for which it is designed, after having determined the good ones, dicing the coated substrate into the plurality of separated substrate portions, and picking a said good one of the substrate portions as the filter;

wherein the method further comprises a step of configuring the filters picked and the filter frame such that the filter frame holds the plurality of filters in the predefined pattern to obtain the optical filter system with the plurality of filters.

In relation to the first aspect—which thus comprises the sub-aspect of the first aspect as well —, and the second aspect, the following is noted:

The filter frame may for example be provided in advance as a prefabricated component, but it may also be provided by making it during the method of the second aspect or the sub-aspect of the first aspect, respectively. Providing the filter frame by making it, may for example be part of the step of configuring. More in general, the method of the second aspect or sub-aspect of the first aspect may at any stage of the method comprise a step of providing the filter frame.

The filter coatings may be applied by laying several so called 'material layers' on top of each other. Each material layer is of a specific material and defines a so called filter coating. A stack of five such material layers on top of each other thus provides five coating layers. The material layers/filter coatings in one stack may be of different materials, but also one or more material layers of same material is conceivable in one stack. Such a material layer can be built up by sputter depositing, for example, 20 molecular/atomic layers over each other in order to thus arrive at, according to this example, a said material layer of 20 molecular layers having a thickness of say about 20 molecules. When in this application the term layer is used in relation to filter coating, the term layer is meant to be a material layer—i.e. a layer of filter coating—and it is, unless said differently, not meant to be an atomic/molecular layer. A simple filter may have up to 20-30 (material) layers, but more complex and complex filters may have about 70 or more (material) layers.

Although in the methods as claimed, the steps of 'dividing' and 'examining the coated substrate to determine' may i) take place in any order. The step of 'dividing' is an (imaginary) dividing up or subdividing of the coated substrate into areas, called substrate portions, while leaving the coated substrate intact, i.e. not cutting or otherwise physically separating it into pieces. To explain this with an example: assuming the coated substrate as a plane defined in an XY coordinate system, one of the substrate portions may for example the square area in which X is between 3 and 4 and Y is between 5 and 6. The fact that the steps of 'dividing', and 'examining the coated substrate to determine' may take place in any order, is illustrated in the below examples three and four:

First example (not according to the claims): The steps of 'dividing' and 'dicing' may take place in one single operation when dicing the coated substrate into separated pieces, called substrate portions. In this case the determining step would take place after the dicing step. This 'determining' may for example be by examining each (diced) substrate portion to see whether it meets the predefined design requirement, and by labelling this substrate portion as a 'good one' if the substrate portion examined meets the predefined design criterion.

Second example (not according to the claims): The step of 'dividing' may take place before the step of 'dicing'. One may first subdivide the coated substrate into areas, the substrate portions, by, for example, defining lines along the coated substrate and subsequently cut the coated substrate along the defined lines to dice the coated substrate into separated substrate portions. The step of determining, then my be like in the first example by examining each (diced) substrate portion ton see whether it meets the predefined design criterion.

Third example (which is according to the claims): The step of 'dividing' may take place before the step of 'dicing' and before the step of 'examining to determine'. One may first subdivide the coated substrate into areas, the substrate portions, by, for example, defining lines along the coated substrate and then examine the intact coated substrate to see in which of the—not yet separated—substrate portions the predefined design requirement is met, and by labeling a substrate portion as a 'good one' if the substrate portion examined meets the predefined design criterion.

Fourth example (which is according to the claims): The step of 'examining to determine' may take place before or simultaneously with the step of 'dividing'. One may examine the coated substrate to see in which zones of the coated substrate the predefined design requirement is met, and by labeling a zones of the coated portion as a 'good zone' if the coated substrate there meets the predefined design criterion. Subsequently or simultaneously, the coated substrate may be subdivided into areas/substrate portions and those substrate portions lying in a 'good zone' may be labelled as the 'good ones'.

In the step of 'creating the stock of the good ones', a stock of the good ones of the diced substrate portions is created, for example by discarding the diced substrate portions not meeting the predefined requirements.

After the step of configuring, the optical filter system to be manufactured results. In the resulting optical filter system the filters of the plurality of filters are attached to the filter frame so that the filter frame holds the filters in the predefined pattern. One may thus say that the step of 'configuring the filters and filter frame' thus boils down to forming or providing the assembly of 'filter frame and filters attached to the filter frame'. Examining to determining the good ones by examining the coated substrate—i.e. the coated substrate before dicing—simplifies the production process, for example when the diced, individual portions may have small dimension like 1 mm×1 mm×1 mm or smaller. Using an orthogonal set of x-axis, y-axis, and z-axis with the z-axis extending in transmission direction of the filter (in other words transverse to the sensor), a diced individual portion may have an y-dimension in the range of 0.8 to 0.9 mm (or less), an x-dimension in the range of 0.25 mm to 0.5 mm (or smaller), and an y-dimension in the range of 0.25 mm to 0.5 mm (or smaller). A diced individual portion may, for example, have an y-dimension of about 0.8 to 0.9 mm, an x-dimension of about 0.4 mm, and an y-dimension of about 0.4 mm.

In an embodiment of the first and second aspect, the step of applying the plurality of filter coatings on the substrate may, for one or more of the filters, comprises applying one or more of the filter coatings by sputter deposition. In a further embodiment of this embodiment, all filters may have one or more filter coatings applied by sputter deposition. In another further embodiment of this embodiment, one or more or all of the filters may have all coatings applied by sputter decomposition. In a supplementary embodiment of these embodiments, the sputter decomposition may comprise ion beam sputtering, also called IBS.

In an embodiment of the first and second aspect, 'the specific spectral sensitivity for which the stack of a said respective filter is designed' is designed to allow passage of a specific range of optical radiation while blocking optical radiation outside the specific range.

In an embodiment of the first and second aspect, the specific range of a first one of the respective filters may be at least partly different from the specific range of another one of the respective filters. In a further embodiment of this embodiment, the specific range of the first one of the respective filters may include a wavelength that is outside the specific range of the another one of the respective filters, and the specific range of the another one of the respective filters may include a wavelength that is outside the specific range of the first one of the respective filters.

In an embodiment of the first and second aspect, the specific range may have a width of 10 nm or less. In a further embodiment of this embodiment, the specific range may have a width of 5 nm or less. In another further embodiment of this embodiment, the specific range may have a width of 2.5 nm or less. The specific range may be 1 nm or less.

In an embodiment of the first and second aspect, the step of determining the good ones of the substrate portions may comprise:
 measuring an optical filter property of the substrate portions (313), and
 identifying a said measured substrate portion as a said good one in case the measured optical filter property meets the predefined design requirement.

In a further embodiment of this embodiment, the optical filter property may be representative of a range of wavelengths that are transmittable through the substrate portion.

In an embodiment of the first and second aspect, the plurality of filters may comprises at least 10 filters. In a further embodiment of this embodiment, the plurality of filters may comprise 20 to 30 filters or more. The plurality of filters may for example comprise 64 filters or more. In another example, the plurality of filters may comprise 256 filters or more.

In an embodiment of the first and second aspect, the plurality of filters, when attached to the filter frame, may be arranged in a 1-dimensional or 2-dimensional array.

In an embodiment of the first and second aspect, the method may further comprise a step of manufacturing one or more further optical filter systems, in which each further optical filter system comprises:
 a further plurality of filters, each filter having a said specific spectral sensitivity, and
 a further filter frame holding the further plurality of filters in a predefined pattern.

This predefined pattern of the further plurality of filters may be the same as the predefined pattern of the (earlier) plurality of filters or may be another predefined pattern than the predefined pattern of the (earlier) plurality of filters.

The step of manufacturing the one or more further optical filter systems may, per further optical filter system, comprise the steps of:
 providing a said further filter frame (this step of providing being an optional step, which may be absent or in case present may take place at any time before or during the method of the first or second aspect, respectively); and
 picking, per said filter of a said specific spectral sensitivity, a said good one of the substrate portions as the filter, and
 configuring the filters picked and the further filter frame such that the further filter frame holds the further plurality of filters in the predefined pattern to obtain the respective further optical filter system with the further plurality of filters.

The further filter frame may for example be provided in advance as a prefabricated component, but it may also be provided by making it during the method of the first or second aspect, respectively. Providing the further filter frame by making it, may for example be part of the step of configuring. More in general, the method of the first or second aspect, respectively, may at any stage of the method of the first or second aspect, respectively, comprise a step of providing the further filter frame.

According to this embodiment, the steps of 'applying', 'dividing', 'determining', and 'dicing' may be common for multiple optical filter systems to be manufactured. Once these steps have been done, and after having provided a sufficient number of filter frames, a plurality of optical filter systems may be manufactured by executing the steps of 'picking' and 'configuring the filters picked and the filter frame'—in short the step of 'configuring'—as many times as there are optical filter systems to be manufactured. The optical filter systems may be manufactured in series by executing the combination of steps of 'picking and configuring' sequentially a multiple of times or by executing one or more combinations of steps of 'picking' in parallel. The steps of 'applying', 'dividing', 'determining', and 'dicing' may be executed at one moment—so to say in advance-in order to create a stock of 'good ones' of substrate portions for each type of filter. The combination of the steps 'picking and configuring' may be executed, depending on demand/orders, at any later moment in time, which may be convenient.

In an embodiment of the first and second aspect, the optical filter system(s) manufactured may be a filter system of a colorimeter.

In an embodiment of the first and second aspect, one or more filters (of the plurality of filters) may have a specific spectral sensitivity different from the spectral sensitivities of other filters (of the plurality of filters). In an example, each of the filters of the plurality of filters may have a specific spectral sensitivity different from the spectral sensitivity of the other filters of the plurality of filters.

In a third aspect of the invention, there is provided a method for manufacturing an optical measurement device comprising:
 an optical filter system, and
 an optical sensor system comprising a plurality of optical sensors provided on a sensor frame, in which the sensor frame may optionally be being different from the filter frame,
which method for manufacturing an optical measurement device comprises the steps of:
 providing the optical sensor system,
 manufacturing the optical filter system according to the method of the first or second aspect of the invention, respectively,
 aligning each optical sensor of the plurality of optical sensors with a said optical filter of the plurality of filters, and fastening the filter frame relative to the sensor frame such that:
    the alignment is maintained, such as fixated, and
    radiation impinging on each of the sensors must first have passed through the filter aligned with the impinged sensor.

The fastening thus is configured to keep the filter frame and sensor frame immovable with respect to each other and to ensure that radiation incident on each sensor must-before it is incident/impinging on the respective sensor-first have passed through the filter associated to (/aligned with) the respective sensor.

In an embodiment of the third aspect, the plurality of filters may consist of an X number of filters, the plurality of sensors consist of an Y number of sensors, and Y≥X.

In an embodiment of the third aspect, the sensors may comprise or may be photodiodes sensitive for radiation in the range of 150-2500 nm, such as in the range of 200-2500 nm.

In an embodiment of the third aspect, the sensors of the provided optical sensor system may be attached to a sensor frame in a predefined sensor array; and, in the step of configuring, the filters may be arranged in a filter array configured to have same dimensions as the predefined sensor array; and the step of 'aligning each optical sensor of the plurality of optical sensors with a said optical filter of the plurality of filters' may comprises aligning the sensor frame with the filter frame.

In an embodiment of the third aspect, the optical measurement device manufactured may be a colorimeter.

In a fourth aspect of the invention, there is provided an optical filter system, wherein the optical filter comprises:
    a filter frame, and
    a plurality of filters attached to the filter frame in accordance with a filter array and each having a specific spectral sensitivity.

In an embodiment of the fourth aspect, the optical filter system has been manufactured according to the method of the first or second aspect, respectively.

In an embodiment of the fourth aspect, the filter coatings have been applied by sputter deposition, such as ion beam sputtering. In this embodiment, the filter coatings may be (material) layers with a thickness in the range of, for example, 10 µm to 650 nm. A simple filter may have 20-30 layers, but more complex and complex filters may have about 70 or more layers.

In an embodiment of the fourth aspect, the specific spectral sensitivity of a said filter is configured to allow passage of a specific range of optical radiation while blocking optical radiation outside the specific range.

In an embodiment of the fourth aspect, the specific range of a first one of the filters is at least partly different from the specific range of another one of the filters. In a further embodiment of this embodiment, the specific range of the first one of the filters may include a wavelength that is outside the specific range of the another one of the filters, and the specific range of the another one of the filters may include a wavelength that is outside the specific range of the first one of the filters.

In an embodiment of the fourth aspect, the specific range may have a width of 10 nm or less. In a further embodiment of this embodiment, the specific range may have a width of 5 nm or less. In another further embodiment of this embodiment, the specific range may have a width of 2.5 nm or less. The specific range may be 1 nm or less.

In an embodiment of the fourth aspect, the plurality of filters comprises at least 10 filters. In a further embodiment of this embodiment, the plurality of filters may comprise 20 to 30 filters or more. The plurality of filters may for example comprise 64 filters or more. In another example, the plurality of filters may comprise 256 filters or more.

In an embodiment of the fourth aspect, the plurality of filters may be attached to the filter frame in a 1-dimensional or 2-dimensional array.

In an embodiment of the fourth aspect, one or more filters (of the plurality of filters) may have a specific spectral sensitivity different from the spectral sensitivities of other filters (of the plurality of filters). In an example, each of the filters of the plurality of filters may have a specific spectral sensitivity different from the spectral sensitivity of the other filters of the plurality of filters.

In a fifth aspect of the invention, there is provided an optical measurement device, which optical measurement device comprises:
    an optical filter system according to the fourth aspect, and
    an optical sensor system comprising a plurality of optical sensors provided on a sensor frame;
wherein the filter frame and sensor frame are different frames, the filter frame carrying the filters and the sensor frame carrying the sensors;
wherein each optical sensor of the plurality of optical sensors is aligned with an optical filter of the plurality of optical filters; and
wherein the filter frame is fastened to the sensor frame such that:
    the alignment is maintained, such as fixated, and
    radiation impinging on each of the sensors must first have passed through the filter aligned with the impinged sensor.

The fastening thus is configured to keep the filter frame and sensor frame immovable with respect to each other and to ensure that radiation incident on each sensor must-before it is incident/impinging on the respective sensor-first have passed through the filter associated to (/aligned with) the respective sensor.

In a sixth aspect of the invention, there is provided an optical measurement device, the optical measurement device comprising:
    a filter frame provided with a filter array of optical filters attached to the filter frame, and
    a sensor frame provided with a sensor array of optical sensors attached to the sensor frame,
wherein the filter array and sensor array have same dimensions,
wherein the filter frame and sensor frame are different frames, the filter frame carrying the optical filters and the sensor frame carrying the optical sensors;
wherein the sensor frame is aligned with the filter frame and attached to the filter frame such that the alignment is maintained and each optical sensor of the plurality of optical sensors is aligned with an optical filter of the plurality of optical filters to ensure that radiation impinging on each of the sensors must first have passed through the filter aligned with the impinged sensor.

The filter array and sensor array having the same dimensions means that the physical outer dimensions, like circumference and/or width and/or height, are the same. The number of array points inside the array may be different, i.e. the number of sensors may be larger than the number of filters. In another embodiment the number of sensors may be equal to the number of filters.

The fastening thus is configured to keep the filter frame and sensor frame immovable with respect to each other and to ensure that radiation incident on each sensor must-before it is incident/impinging on the respective sensor-first have passed through the filter associated to (/aligned with) the respective sensor.

In an embodiment of the fifth and/or sixth aspect, the sensors may comprise photodiodes sensitive for radiation in the range of 150-2500 nm, such as in the range of 200-1100 nm.

In an embodiment of the fifth and/or sixth aspect, the plurality of filters may consist of an X number of filters, the plurality of sensors consist of an Y number of sensors, Y≥X.

In an embodiment of the fifth and/or sixth aspect, the plurality of sensors comprises at least 10 sensors. In a further embodiment of this embodiment, the plurality of sensors may comprise 20 to 30 sensors or more. The plurality of sensors may for example comprise 64 sensors or more. In another example, the plurality of sensors may comprise 256 sensors or more.

In an embodiment of the fifth and/or sixth aspect, the plurality of sensors is attached to the sensor frame in a 1-dimensional or 2-dimensional array.

In an embodiment of the fifth and/or sixth aspect, the optical sensor system is a photodiode array.

In an embodiment of the fifth and/or sixth aspect, the photodiode array is one of: an 4×4 photodiode array, an 8×8 photodiode array, or an 16×16 photodiode array.

In an embodiment of the fifth and/or sixth aspect, the optical measurement device is a colorimeter.

In a seventh aspect of the invention, the invention relates to use of the optical measurement device according to sixth aspect for measuring a color/colors of an object.

In an embodiment of the seventh aspect, the object is a display irradiating the color/colors.

BRIEF DESCRIPTION OF THE DRAWINGS

The invention will be described in more detail below under reference to the figures. In the figures exemplary embodiments of the invention are shown. The figures show in.

DETAILED DESCRIPTION

Figure 1:
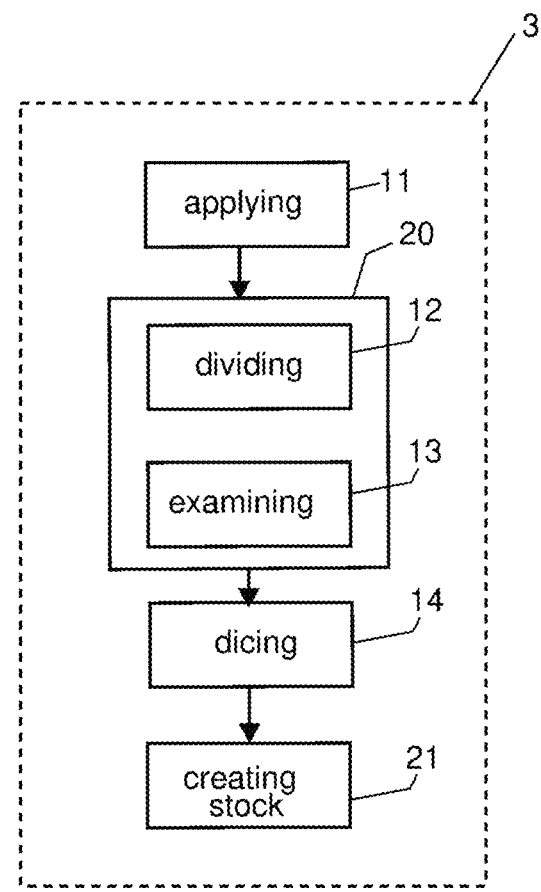
FIG. 1: a method for manufacturing filters for an optical system according to the first aspect of the invention.

FIG. 1 shows on a highly schematical level an example of the method according to the first aspect of the invention—see the dashed rectangle 3—for manufacturing filters for use in an optical system 500—see—according to the fourth aspect of the invention.

Figure 2:
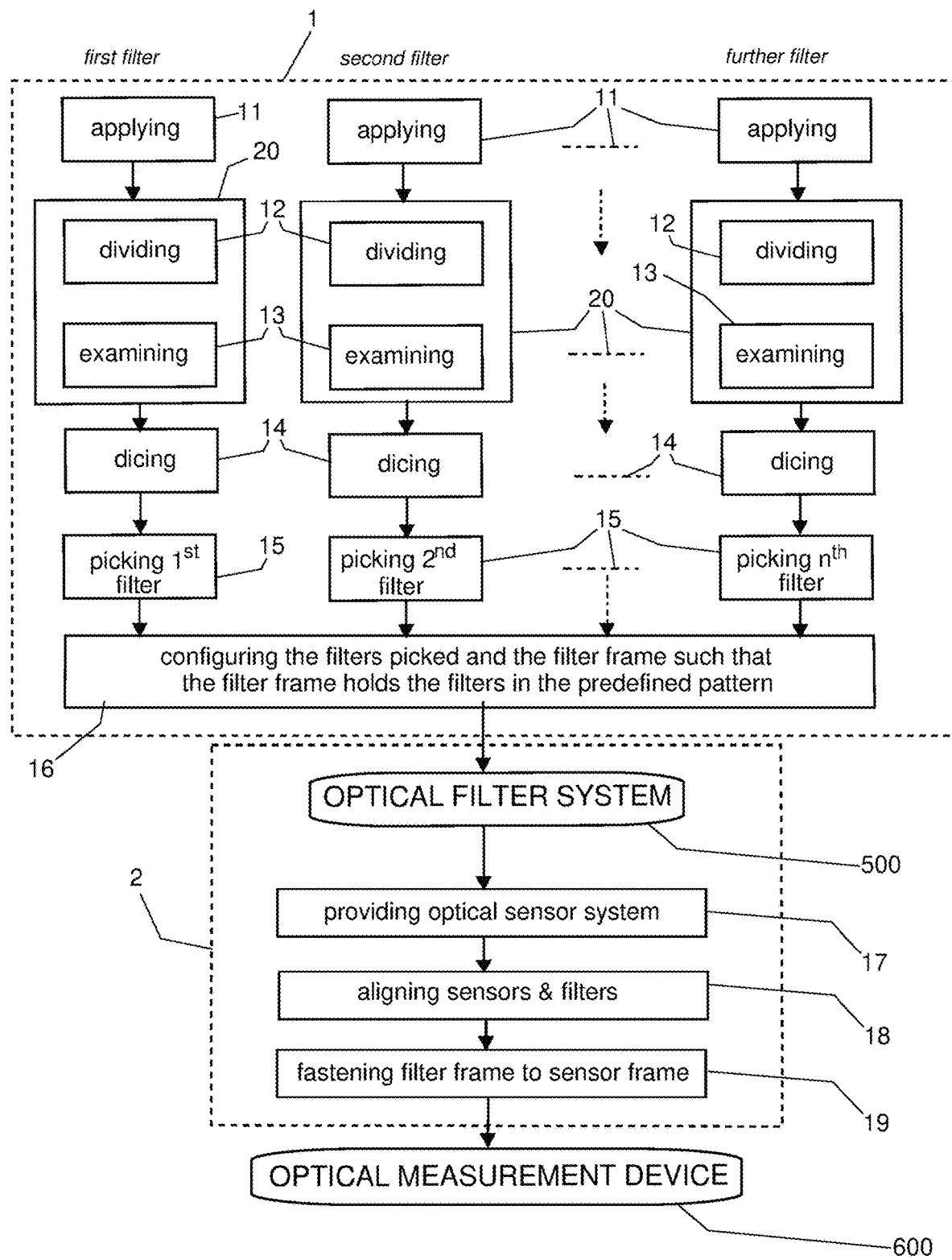
FIG. 2: a method for manufacturing an optical filter system according to the second aspect of the invention.

FIG. 2 shows on a highly schematical level an example of the method according the second aspect of the invention—see the dashed rectangle 1—for manufacturing an optical filter system 500—see FIG. 9—according to the fourth aspect of the invention. FIG. 2 further shows on a highly schematical level an example of the method according to the third aspect of the invention—see the dashed rectangle 2—for manufacturing an optical measurement device 600—see FIG. 11—according to the fifth and/or sixth aspect of the invention.

The optical filter system 500 is shown in FIG. 9. The optical filter system 500 comprises a filter frame 501 and at least a first filter 313 and a second filter 313' attached to the filter frame 501. As shown in FIG. 9 the optical filter system 500 may additionally have further filters 502-506. In the example of FIG. 9 the filters 313, 313, 502-506 are arranged in a 5×4-array.

Referring to FIG. 1, the method for manufacturing filters for an optical filter system, comprises:
steps of creating the filters (steps 11, 20, 14), in which steps the filters are actually created, and
a step of creating a stock (step 21) of filters meeting a predefined design criterium. Referring to FIG. 2 and FIG. 3-5, the filters 313 are created by:
applying one or more filter coatings 201-203—i.e. 201, 202, 203—on a substrate 200 (step 11); which results in a coated substrate provided with a stack 210 of first filter coatings 201-203, see FIG. 3;
followed by step 20 comprising the sub-steps of:
dividing the first coated substrate 200 into a plurality of first substrate portions (step 12); see the (imaginary) vertical lines 300 and (imaginary) horizontal lines 301 in FIG. 4, which lines subdivide the first coated substrate into a plurality of first substrate portions,
examining the (undiced) coated substrate to determine the good ones 313 of the substrate portions 311-314 (step 13), see FIG. 5.
which sub-steps of 'dividing' and 'examining' may take place in any order as well as simultaneously. At the stage of these sub-steps 'dividing' and 'examining' the substrate portions are so to say 'imaginary' substrate portions as the dicing did not yet take place.
followed by dicing the first coated substrate 200 into the plurality of substrate portions 311-314 (step 14). At this stage the coated substrate is physically separated into (diced) substrate portions 311, 312, 313.

These one or more first filter coatings may be a plurality of first filter coatings as is assumed in the rest of this 'detailed description'. But as the skilled man will understand everywhere where 'a plurality of first filter coatings' is written one can also read 'one or more first filter coatings'.

After the steps of creating (steps 11, 20 and 14), a stock of good ones of the substrate portions is created, for example by discarding the diced substrate portions which do not have the desired filter properties, i.e. which do not meet the predefined design requirement.

Referring to FIG. 2, the method for manufacturing an optical filter system comprises:
steps of creating the first filter 313 (steps 11, 20, 14), creating the second filter 313' (steps 11, 20, 14), and creating the further filters, i.e. the $3^{rd}$ to the $n^{th}$ filters (steps 11, 20, 14);

steps of picking the first filter 313 (step 15), picking the second filter 313' (step 15), and picking the further filters, i.e. the $3^{rd}$ to the $n^{th}$ filters (step 15); and the step of configuring (step 16) the filters picked and the filter frame such that the filter frame holds the filters in the predefined pattern.

Although in FIG. 2 the side-by-side arrangement of the process in relation to the $1^{st}$, $2^{nd}$, to the $n^{th}$ filter might suggest that these are done in parallel or simultaneously, it will be clear that this may not be the case. The steps 11, 20, 14 and 15 for the $1^{st}$, $2^{nd}$, to the $n^{th}$ filter may indeed take place in parallel or simultaneously, but it is very well conceivable that these steps in relation to the $2^{nd}$ and $n^{th}$ filter take place after the steps in relation to the $1^{st}$ filter, that the steps 11, 20, 14 of the $1^{st}$, $2^{nd}$, to the $n^{th}$ filter take place in parallel or simultaneously but that the step 15 for the $2^{nd}$ filter take place after the step 15 for the $1^{st}$ filter, or that these steps take place in any other order.

Figure 4:
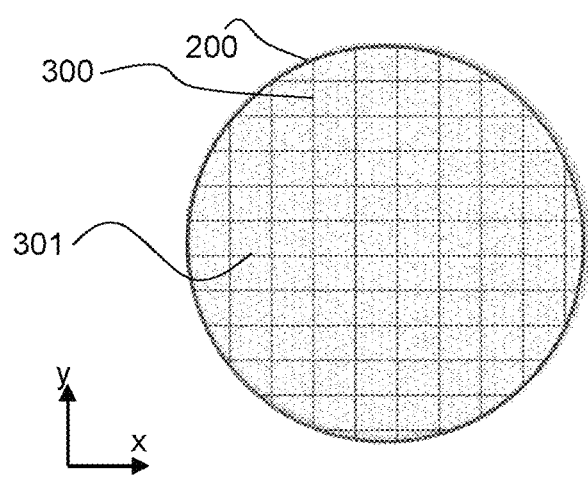
FIG. 4: the step of dicing the first substrate into a plurality of first substrate portions according to the first and second aspect of the invention, respectively.
Figure 4:
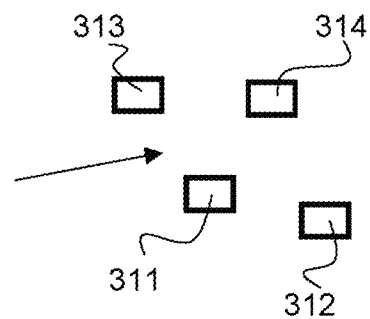
Figure 5:
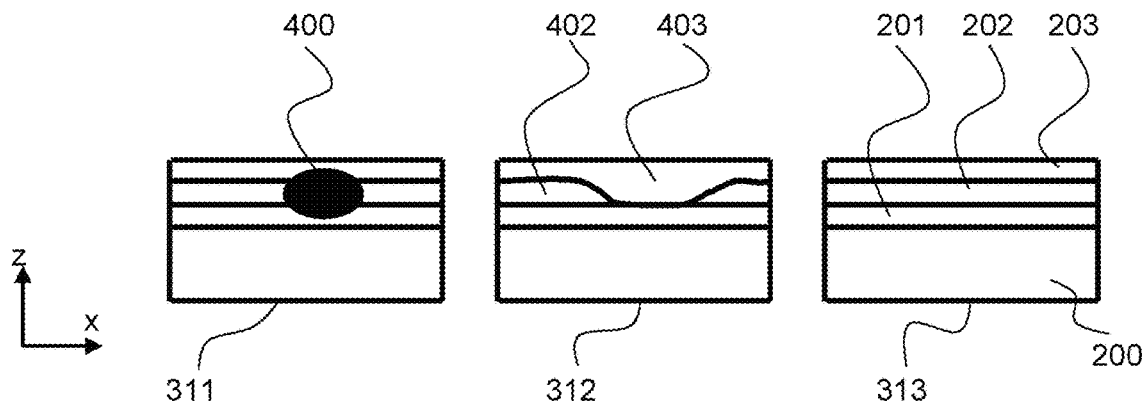
FIG. 5: a detailed view of the first substrate portions.

Referring to FIG. 2 and FIG. 3-5, the first filter 313 is—similar as discussed above in relation to FIG. 1—created by:

applying one or more first filter coatings 201-203—i.e. 201, 202, 203—on a first substrate 200 (step 11); which results in a first coated substrate provided with a stack 210 of first filter coatings 201-203, see FIG. 3;

dividing the first coated substrate 200 into a plurality of first substrate portions (step 12); see the (imaginary) vertical lines 300 and (imaginary) horizontal lines 301 in FIG. 4, which lines subdivide the first coated substrate into a plurality of first substrate portions;

examining the coated substrate to determine the good ones 313 of the first substrate portions 311-314 (step 13), see FIG. 5; and dicing the first coated substrate 200 into the plurality of first substrate portions 311-314 (step 14).

These one or more first filter coatings may be a plurality of first filter coatings as is assumed in the rest of this 'detailed description'. But as the skilled man will understand everywhere where 'a plurality of first filter coatings' is written one can also read 'one or more first filter coatings'. The steps of 'dividing' and 'examining' may take place in any order as well as simultaneously, before the step of 'dicing' takes place.

Figure 8:
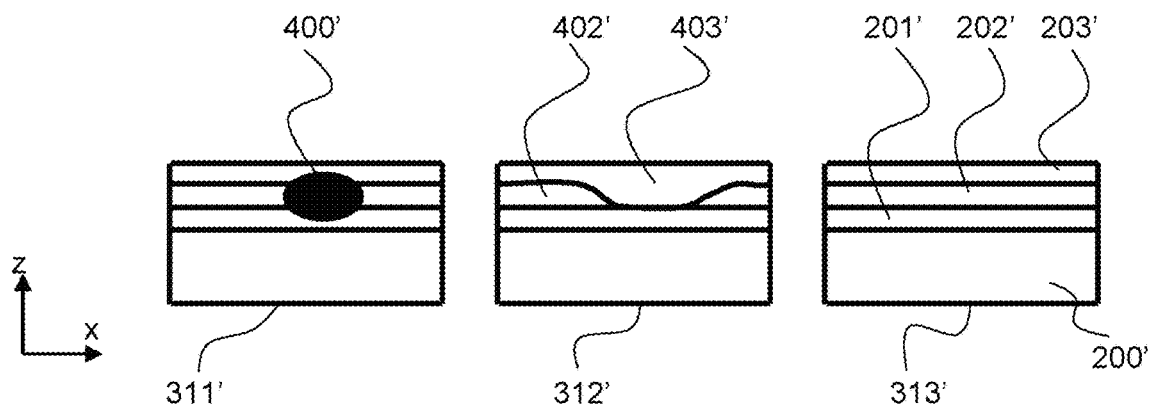
FIG. 8: a detailed view of the second substrate portions.
Figure 7:
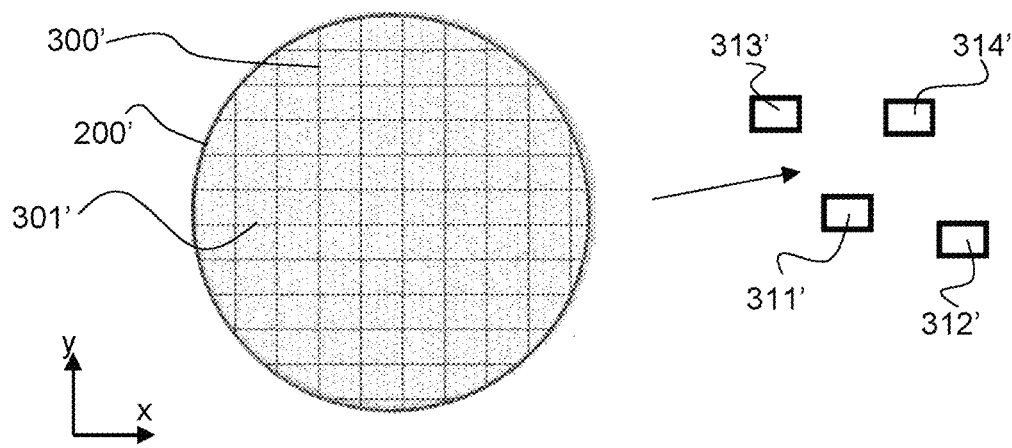
FIG. 7: the step of dicing the second substrate into a plurality of second substrate portions according to the first and aspect of the invention, respectively.

Referring to FIG. 2 and FIG. 6-8, the second filter 313' may be created in similar manner by:

applying one or more second filter coatings 201'-203'—i.e. 201', 202', 203'—on a second substrate 200' (step 11); which results in a second coated substrate provided with a stack 210' of second filter coatings 201'-203', see FIG. 6;

dividing the second coated substrate 200 into a plurality of second substrate portions (step 12); see the (imaginary) vertical lines 300' and (imaginary) horizontal lines 301' in FIG. 7, which lines subdivide the second coated substrate into a plurality of second substrate portions 311'-314';

examining the coated substrate to determine the good ones 313' of the second substrate portions 311'-314' (step 13), see FIG. 8; and dicing the second substrate 200' into the plurality of second substrate portions 311'-314' (step 14).

Also, these one or more second filter coatings may be a plurality of second filter coatings as is assumed in the rest of this 'detailed description'. But as the skilled man will understand everywhere where 'a plurality of second filter coatings' is written one can also read 'one or more second filter coatings'. The steps of 'dividing' and 'examining' may take place in any order as well as simultaneously, before the step of 'dicing' takes place.

As the skilled man will understand, also the further filters 502-506 may be created in similar manner, and also, these one or more further filter coatings may be a plurality of further filter coatings as is assumed in the rest of this 'detailed description'. But as the skilled man will understand everywhere where 'a plurality of further filter coatings' is written one can also read 'one or more further filter coatings'.

Applying filter coatings 201-203 and 201'-203' is a delicate process. The filter coatings 201-203 and 201'-203' are thin layers of materials, such as magnesium fluoride, calcium fluoride, silicon-dioxide, other silicon-oxides, or metals like aluminum, silver, gold, tantalum, titanium, hafnium, other metals, and metal oxides like ditantalum-pentoxide, titanium-dioxide. By applying the filter coatings 201-203, 201'-203' with a certain thickness and density, the desired filter properties are obtained. The thickness and density of the thin layers cause destructive interference of light with certain wavelengths causing light with those wavelengths to be blocked, whereas light with other wavelengths is transmitted through the thin layers. The filter coatings may be layers of atomic or molecular thickness. The thickness of the filter coatings may be in the range of 50-400 nm.

Because of the small thickness, any deviation in the thickness of the filter coating may result in a filter that does not meet its specification. For example, a deviation in the thickness may cause a filter to allow passage of wavelengths outside the desired range, or to block part of the light with wavelengths that are intended to be allowed to pass. The chance of successfully applying the filter coatings 201-203, 201'-203' without any significant deviation may be about 50% or lower. For example, with a success rate of 99% per coating layer, the chance of successfully applying 64 coating layers is about 52%.

By making the first filter 313 by applying a first plurality of filter coatings 201-203 on a first substrate 200 (step 11), dividing the first coated substrate into a plurality of first substrate portions (step 12), examining the first coated substrate to determine the good ones of the first substrate portions (step 13), and then dicing the first coated substrate 200 into a plurality of first substrate portions 311-314 (step 14), it is possible to pick a good one of the plurality of first substrate portions 311-313 as the first filter 313 (step 15), which ensures that the substrate portion 313 used in the optical filter system is one where the plurality of filter coatings has been applied successfully. Even when a large portion of the first substrate portions 311-314 has significant deviations of the filter coatings 201-203, a first substrate portion with proper filter coatings 201-203—called a good one—can be selected.

Similar to the first filter 313, making the second filter 313' by applying a second plurality of filter coatings 201'-203' on a second substrate 200' (step 11), dividing the second coated substrate into a plurality of second substrate portions (step 12), examining the second coated substrate to determine the good ones of the second substrate portions (step 13), dicing the second coated substrate 200 into a plurality of second substrate portions 311'-314' (step 14), allows picking a good one 313' of the plurality of second substrate portions 311'-314' as the first filter 313' (step 15).

Similar applies for the further filters. The overall result is that the resulting optical filter system is an optical filter system in which all filters will meet their predefined specs.

The 'step of configuring the filters picked and the filter frame such that the filter frame holds the filters in the predefined pattern', is in this application in short also called the 'step of configuring'. Some examples of the 'step of configuring' a) The 'step of configuring' may comprise configuring a filter frame with openings for holding or receiving the filters. The configuring of the filter frame may, in a first example, comprise drilling holes in a plate to obtain the filter frame with openings. The configuring of the filter frame may, in a second example, comprise: arranging a first set of parallel wires over a second set of parallel wires extending transverse to the wires of the first set, and soldering these wires together at their nodes where wires of one set cross the wires of another set, resulting in the filter frame with openings. The configuring of the filter frame may, in a third example, comprise providing an adhesive on the filter frame, such as in the holes of the frame of the preceding first and second example, to allow the filters to be fixed to or attached to the filter frame (or vice versa the filter frame to the filters).

b) The 'step of configuring' may comprise configuring the filters picked. Configuring of the filters picked may, in a first example, comprise placing or arranging the filters in the predefined pattern. In a second example configuring the filters picked may comprise providing an adhesive on the filters to allow them to be fixed to or attached to the filter frame (or vice versa the filter frame to the filters).

c) The 'step of configuring' may further comprise applying an adhesive to the filters picked and to the frame—for example on the frame or in openings of the frame-so that the filters become attached to the filter frame or vice versa the filter frame becomes attached to the filters once brought together.

In the known optical filter systems the filter coatings 201-203 of multiple filters are provided directly onto the sensors which are already provided on a sensor frame 606. As a result, all filters need to be created successfully to obtain a functional optical filter system. If not, the sensor frame provided with the sensors can be regarded as waste. To avoid wasting frames with sensors, the optical filter coatings 201-203 in known optical filter systems are provided very accurately, but very slowly. But even then, the yield of a successful optical filter system is very low.

By manufacturing the filters according to the first aspect of the invention and/or the optical filter system 500 according to the second aspect of the invention, the yield is improved compared to known filters respectively optical filter systems on which multiple filters are provided directly. According to the invention, the first substrate 200 may be coated with the first plurality of filter coatings 201-203 at an increased speed, because it is not required that the coatings 201-203 are applied properly across the entire surface of the first substrate 200. The first substrate 200 may be diced into several hundreds of first substrate portions 311-313 having dimensions like 1 mm×1 mm×1 mm or smaller. The first substrate portion may have dimensions as mentioned before in relation to a diced, individual portion, for example an y-dimension/height of about 0.8 to 0.9 mm, an x-dimension of about 0.4 mm, and an y-dimension of about 0.4 mm, in which the x-axis, y-axis, and z-axis define an orthogonal set of axes. With the increased speed, the several hundreds of first substrate portions 311-313 may result in several tens of successful first substrate portions 311-313, which are produced in a cost effective way. Similarly, the second substrate 200' may be coated with the second plurality of filter coatings 201'-203' at an increased speed, because it is not required that the coatings 201-203 are applied properly across the entire surface of the second substrate 200'. The second substrate 200' may be diced into several hundreds of second substrate portions 311'-313' having dimensions like 1 mm×1 mm×1 mm or smaller. The second substrate portion may have dimensions as mentioned before in relation to a diced, individual portion, for example an y-dimension/height of about 0.8 to 0.9 mm, an x-dimension of about 0.4 mm, and an y-dimension of about 0.4 mm, in which the x-axis, y-axis, and z-axis define an orthogonal set of axes. With the increased speed, the several hundreds of first substrate portions 311-313 may result in several tens of successful second substrate portions 311'-313', which are produced in a cost effective way.

Because of the cost effective way that the first filter 313, the second filter 313', and further filters 502-506 are created, the resulting optical filter system 500 is produced at a reduced cost. In this respect, it is noted that when manufacturing the filters according to the first aspect and/or the optical filter system according to the second aspect, the cost price per filter may be in the range of 1/100 to 1/50 of the cost of the optical sensor system to which the filters are applied.

In addition or alternatively, the time for manufacturing the optical filters 313 and/or the optical filter system 500 is more predictable. It is highly likely that at least one successful first filter 313 is created when applying the first plurality of filter coatings 201-203 on the first substrate 200, and that at least one successful second filter 313' is created when applying the second plurality of filter coatings 201'-203' on the second substrate 200'. As a result, the method according to the invention leads, more predictably, to a successful optical filter system 500. In comparison, in case, according to the prior art, the filter coating of the last filter on a known optical filter system is not successful, a completely new optical filter system needs to be made, which requires additional manufacturing time.

Figure 11:
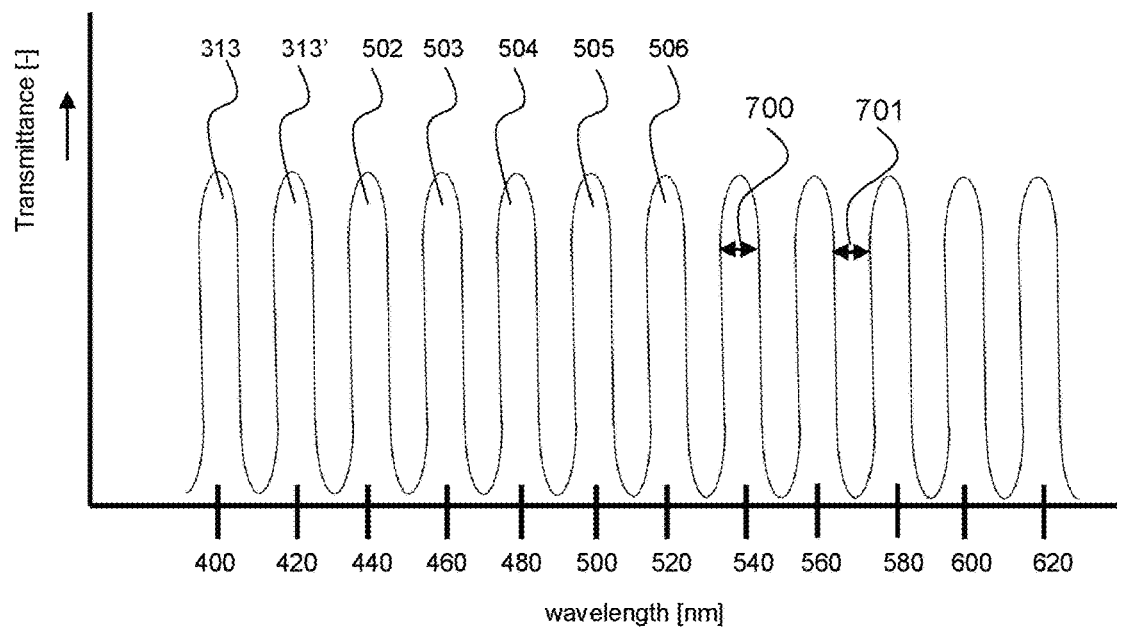
FIG. 11: filter properties of the optical filter system according to the third aspect of the invention.

The optical filter system 500 is a system that is configured to receive light or a light beam from an object, see FIG. 11. The light is, for example, irradiated by the object, such as in case the object is a color display. In another example, the object may reflects light, wherein the color of the object influences the wavelengths that are present in the reflected light. The light received by the optical filter system may comprises multiple wavelengths in the visible light spectrum, and/or the light may comprise one or more wavelengths outside the visible light spectrum, such as in the infrared range or in the ultraviolet range.

The optical filter system 500 has at least the first filter 313 and the second filter 313'. The first filter 313 and the second filter 313' are, for example, arranged such that both are irradiated by the light. For example, the first filter 313 and the second filter 313' are arranged in the same plane facing in the direction of the light. The first filter 313 is an optical filter that is able to allow passage of light with a certain wavelength. So when the light irradiated arrives at the first filter 313, only light with those certain wavelengths is able to pass the first filter 313. Light having other wavelengths is not able to pass the first filter 313. Also the second filter 313' is an optical filter that is able to allow passage of light with a certain wavelength. So when the light irradiated arrives at the second filter 313', only light with those certain wavelengths are able to pass the second filter 313'. Light having other wavelengths is not able to pass the second filter 313'. The first filter 313 and the second filter 313' may allow passage of the same wavelengths and/or of different wavelengths. For example, the first filter 313 may allow passage of a first range of wavelengths, and the second filter 313' may allow passage of a second range of wavelengths. The first range of wavelengths may, for example, be the same as the second range of wavelengths, may be different from the second range of wavelengths or may partly overlap with the second range of wavelengths.

For example, the wavelengths that are able to pass the first filter 313 and the second filter 313' are wavelengths of interest, whereas the first filter 313 and the second filter 313' block other wavelengths that are not of interest. By blocking the other wavelengths that are not of interest, the presence and the intensity of those wavelengths of interest can be determined more accurately. For example, the first filter 313 is paired with a first optical sensor 605—see FIG. 11. The first filter 313 allows passage of the wavelengths of light that are received by the first optical sensor 605. This way, the first optical sensor 605 is able to generate a signal representative of the wavelengths that pass the first filter 313. For example, the second filter 313' is paired with a second optical sensor 605'—see FIG. 11. The second filter 313' allows passage of the wavelengths of light that are received by the second optical sensor 605'. This way, the second optical sensor is able to generate a signal representative of the wavelengths that pass the second filter 313'.

The first optical sensor 605, the second optical sensor 605', and further optical sensors may be mutually identical, i.e. have basically the same specs. But it is also conceivable that all optical sensors are mutually different. More in general any combination of identical sensors and different sensors is possible.

The filter frame 501 is a structural element that supports the first filter 313 and the second filter 313'. According to a first example, the filter frame 501 may comprise a glass structure that is transmissive to light. The light is able to pass through the transparent structure to reach the at least first filter 313 and the second filter 313', and/or the light that is allowed to pass through the first filter 313 or second filter 313' is able to pass through the glass structure. For example, the transparent structure comprises glass. According to a second example, the filter frame 501 comprises openings in which the first filter 313 and the second filter 313' are arranged. Even though the filter frame 501 blocks the light, light is able to pass through the openings of the filter frame 501. In this example, the filter frame 501 may be opaque.

Dicing the first substrate 200 into the plurality of first substrate portions 311-314 is, for example, done by cutting or sawing or grinding. For example, dicing is done using a precision diamond dicing apparatus. For example, the dicing is done by plasma cutting or laser cutting. Dicing the second substrate 200' into the plurality of second substrate portions 311'-313' is, for example, done in the same way as or in another way than dicing the first substrate 200 into the plurality of first substrate portions 311-314. For example, the first substrate portions 311-314 are diced to have the same size or a different size than the second substrate portions 311'-314'.

The step of picking a good one of the plurality of first substrate portions 311-314 as the first filter 313 is, for example, by selecting a first substrate portion on which the filter coatings 201-203 are properly applied and then picking it up. The first substrate portion or a determined 'good one' of the first substrate portions may, for example, be subjected to further manufacturing steps such as adding one or more additional coatings, and/or polishing and/or grinding. Polishing may, for example, be performed to achieve a desired surface finish of the first filter 313. Grinding may, for example, be performed to achieve a desired geometrical shape of the first filter 313.

The step of selecting picking a good one of the plurality of second substrate portions 311'-313' as the second filter 313' is, for example, by selecting a second substrate portion on which the filter coatings 201-203 are properly applied and then picking it up. The second substrate portion or a determined 'good one' of the second substrate portions may, for example, be subjected to further manufacturing steps such as adding one or more additional coatings, and/or polishing and/or grinding. Polishing may, for example, be performed to achieve a desired surface finish of the second filter 313'. Grinding may, for example, be performed to achieve a desired geometrical shape of the second filter 313'.

The first filter 313 and the second filter 313' are attached to the filter frame 501, for example, by bonding or gluing.

In an embodiment, at least one of or all of:
- the step of applying the first plurality of filter coatings 201-203 on the first substrate 200,
- the step of applying the second plurality of filter coatings 201'-203' on the second substrate 200', and
- the step(s) of applying the further plurality of filter coatings on the further substrate, may comprise applying the one or more of the filter coatings or the entire plurality of filter coatings 201-203 by sputter deposition.

Sputter deposition is a physical vapor deposition (PVD) method of thin film deposition. By using sputter deposition, the filter coatings are applied to the entire respective substrate. Because the filter coatings are applied to the entire substrate, the sputter deposition is applied to a large surface area simultaneously. This way, the filter coatings are applied to a large surface in a time efficient way. Also, the rate at which the sputter deposition takes place may be increased, because it is acceptable that some parts of the substrate may not be properly provided with the filter coatings 201-203. For example, the filter coatings 201-203 may not be applied properly near the edge of the substrate. However, the remaining surface of the first substrate 200 and the second substrate 200' provides a sufficient amount of successful filter coatings 201-203.

In an embodiment, applying the plurality of filter coatings by sputter deposition comprises applying ion beam sputtering.

Ion beam sputtering is a method in which an ion beam is directed towards a target. Atoms or molecules are sputtered and directed towards the respective substrate to apply the filter coatings. Ion beam sputtering provides the filter coatings accurately and with less contamination than other types of sputter deposition. However, ion beam sputtering is typically a slower process. By using ion beam sputtering in the method according to the invention, the time lost by the slow process is at least partly compensated by applying the filter coatings to an entire substrate. This way, multiple filter are created simultaneously, thus achieving an acceptable manufacturing time per filter.

In an embodiment, the steps of applying the plurality of filter coatings on the substrate comprises applying a plurality of filter coatings configured to allow passage of a first range of optical radiation through the plurality of filter coatings while blocking optical radiation outside the first range, wherein the specific range of a first one of the respective filters may optionally be at least partly different from the specific range of another one of the respective filters. In this embodiment, the filter coatings 201-203 of the first filter 313 may for example be applied to allow passage of a first range of optical radiation, for example red light, and the filter coatings 201'-203' of the second filter 313' may be applied to allow passage of a second range of optical radiation, for example green light. This allows the optical filter system 500 to separate different colors. For example, the optical filter system 500 separates different colors to lead each color to a dedicated sensor. In an example, the first range is completely separate from the second range, such as in the example that the first range are wavelengths less than 400 nm, whereas the second range are wavelengths higher than 500 nm. In another example, there is overlap between the first range and the second range. For example, the first range are wavelengths of 400-700 nm, whereas the second range has wavelengths of 450-700 nm. For example, the first range has a different cut off frequency than the second range.

In an embodiment, the first range includes a wavelength that is outside the second range. The second range includes a wavelength that is outside the first range. According to this embodiment, the first range has at least a wavelength that is not present in the second range, and the second range has at least a wavelength that is not present in the first range. This way, the optical filter system 500 separates different wavelengths of the light to allow for an improved analysis of the different wavelengths. For example, the first range is completely separated from the second range. For example, the first range has wavelengths 400-450 nm, whereas the second range has wavelengths 500-550 nm. In another example, the first range and the second range party overlap. For example, the first range has wavelengths 400-450 nm, whereas the second range has wavelengths 425-475 nm.

In an embodiment, the specific range may have a width of 25 nm or less. The second range may according to one example have a width of 10 nm or less and may according to another example have a width of 5 nm or less. According to this exemplary embodiment, the specific range may have a width of 2.5 nm or less than 2.5 nm. According to this exemplary embodiment, the specific range may also have a width of 1 nm or less than 1 nm. By applying the filter coating according to the invention, filters can be created cost effectively that allow passage of light with wavelengths that are within a small range from each other. By having such a small width, the optical filter system 500 allows the separation of the light with an improved resolution, similar to a much more expensive spectrometer. In an example, additional filters are attached to the filter frame 501 in addition to the first filter 313 and the second filter 313'. Each of the filters has a different range to cover a large range of wavelengths. For example, the first filter 313 has a range of 400-402 nm, the second filter 313' has a range of 402-404 nm, one of the additional filters has a range of 406-408 nm, another of the additional filters has a range of 408-410 nm etc.

In an embodiment, the step of examining the coated substrate to determine the good ones of the substrate portions comprises:
  measuring an optical filter property of the substrate portions 311-314, and
  labelling and/or identifying a said measured substrate portion as a good one in case the
  measured optical filter property meets the predefined design criterium.

According to this embodiment, before the first substrate 200 is diced into the first substrate portions 311-313, each of the first substrate portions is measured to assess the first optical filter property of that one first substrate portion. In case the filter coatings 201-203 have been applied properly on that one first substrate portion, this first substrate portion meets the first requirement and is labelled as a good one. Then the first substrate portion is labelled as a good one and may later on be picked as the first filter 313. In case the filter coatings 201-203 have not been applied properly—see for example substrate portion 312 in FIG. 5—, or in case there is a contamination 400 in the filter coatings 201-203—see for example substrate portion 311 in FIG. 5—, that one first substrate portion does not meet the first requirement and may optionally be labelled accordingly to be discarded. Then a next first substrate portion is measured to assess the first optical filter property and then the steps are repeated. In a similar way, before the second substrate 200' is diced into the second substrate portions 311'-313', one of the second substrate portion is measured to assess the second optical filter property of that one second substrate portion. In case the filter coatings 201'-203' have been applied properly on that one second substrate portion, the second substrate portion meets the second requirement and this second substrate portion is labelled as a good one and may later one be picked as the second filter 313'. In case the filter coatings 201'-203' have not been applied properly—see the substrate portion 312' in FIG. 8—, or in case there is a contamination 400' in the filter coatings 201'-203'—see the substrate portion 311' in FIG. 8, that one second substrate portion does not meet the second requirement and may optionally be labelled accordingly.

The measurement may include, for example, measuring a parameter representative of the transmission of light through the substrate portions or through the coated substrate. The measurement may includes, for example, measuring a spectrum of light transmitting through the substrate portions or the coated substrate. The measurement may include, for example, examining the substrate portions or coated substrate with a microscope. The first requirement and the second requirement may be representative of the optical filter property that is measured in case the filter coatings 201-203 respectively 201'-203' are applied properly. In case a substrate portion meets the requirement, that substrate portion is able to perform the desired filtering of the light.

In an embodiment, the optical filter property is representative of a range of wavelengths that are transmittable through the substrate portion. By measuring the optical filter property that is representative of a range of wavelengths that are transmittable through the substrate portion, the measurement gives a good prediction about whether the substrate portion will result in a proper filter.

In case of one or more additional filters, these additional filters may be made or created in a similar way as the first filter 313 and the second filter 313'. For each additional filter, a further substrate is applied with one or more filter coatings. The further coated substrate is divided into a plurality of further substrate portions, good ones of these further substrate portions are determined, and the further coated substrate is diced into the further substrate portions. A further substrate portion is picked as the additional filter when it is a good one, and the additional filter is attached to the filter frame 501.

The wave length range of each filter may be different. The range of the first filter 313, the second filter 313' and the additional filters 502-506 may be different from each other. Because of these different ranges, the optical filter system 500 is able to filter light that includes a large range of wavelengths. For example, all filters together span a range between ultraviolet and near infrared. For example, all filters together span a range of 380 nm-780 nm. Because each filter has its own range, the optical filter system 500 is able to accurately separate the different wavelengths. It is however to be noted, that not all filters have to be different by definition. It may be useful to provide each filter in duplicate or triplicate to allow for redundancy, or to serve as a reserve in case a filter or sensor might fail to function properly, or to increase sensitivity, for example in case a specific wave length might be difficult to detect.

In an embodiment, the method according to the first aspect and/or second aspect comprises the step of attaching at least 64 filters to the filter frame 501, for example, at least 256 filters. According to this embodiment, the optical filter system 500 has 64 filters, i.e., the first filter 313, the second filter 313' and 62 additional filters. When providing each filter with a range that is different from the other filters, and dividing the ranges over the spectrum of visible light (380 nm-780 nm), the optical filter system 500 is able to obtain a resolution of 6.25 nm. This resolution equals the resolution of an expensive high-end spectrometer. For example, each of the 64 filters is paired with a sensor. The sensors provide their sensor signals to a processing unit. Each of the 64 sensor signals is representative of an intensity of the wavelengths in the range of the corresponding filter. Because the number 64 is a power of 2, the processing unit is able to efficiently process the sensor signals, for example by using Fast Fourier Analysis.

According to an example of this embodiment, the optical filter system 500 has 256 filters, i.e., the first filter 313, the second filter 313' and 254 additional filters. When providing each filter with a range that is different from the other filters, and dividing the ranges over the spectrum of visible light (380 nm-780 nm), the optical filter system 500 is able to obtain a resolution of 1.56 nm. This resolution is better than the typical resolution of an expensive high-end spectrometer. Because the number 256 is a power of 2, the processing unit is able to efficiently process the sensor signals, for example by using Fast Fourier Analysis In an embodiment, the method according to the first aspect and/or second aspect comprises the step of attaching the first filter 313, the second filter 313' and the additional filters to the filter frame 501 arranged in a 1-dimensional or 2-dimensional array. By arranging the filters in an array-like a line or a matrix pattern-, the light can be directed to the filters using relatively simple optics, such as mirrors, lenses and diffusors. For example, having 64 filter allows for a convenient arrangement of the filters on the filter frame 501 in an 8×8 matrix. For example, having 256 filter allows for a convenient arrangement of the filters on the filter frame 501 in a 16×16 matrix.

In an embodiment, the method comprises the step of manufacturing a further optical filter system 500, wherein the further optical filter system 500 comprises a further filter frame 501, and at least a further first filter 313 and a further second filter 313' attached to the further filter frame 501. The step of manufacturing the further optical filter system 500 comprises the steps of: 'picking', per said filter of a said specific spectral sensitivity, a said good one of the substrate portions, and 'configuring' the good ones picked and the further filter frame to obtain the respective further optical filter system with the further plurality of filters. According to this embodiment, the step of applying the first plurality of filter coatings 201-203 on the first substrate 200, and dicing the first substrate 200 into the first substrate portion has resulted in the creation of at least two successful first substrate portions, 'successful' meaning (in this application) that it is within predefined specifications/meets predefined requirements. One of those first substrate portions 311-313 is used in the optical filter system 500. The other of those first substrate portions 311-313 is used in the further optical filter system 500. So by applying the first plurality of filter coatings 201-203 on the first substrate 200, filters for a plurality of optical filter system 500 are created simultaneously. For example, a single first substrate 200 provides sufficient filters for more than 10 or more than 50 or more than 100 optical filter systems 500. According to this embodiment, the step of applying the second plurality of filter coatings 201'-203' on the second substrate 200', and dicing the second substrate 200' into the second substrate portions 311'-313' has resulted in the creation of at least two successful second substrate portions. One of those second substrate portions 311'-313' is used in the optical filter system 500. The other of those second substrate portions 311'-313' is used in the further optical filter system 500. So by applying the second plurality of filter coatings 201'-203' on the second substrate 200', filters for a plurality of optical filter systems 500 are created simultaneously. For example, a single second substrate 200' provides sufficient filters for more than 10 or more than 50 or more than 100 optical filter systems 500. Similar applies for further filters.

For example, a batch of first substrate portions 311-313, a batch of second substrate portions 311'-313', and batch(es) of further substrate portions may be held in storage till a customer orders an optical filter system 500. Then, one or more of the first substrate portions 311-313, one or more of the second substrate portions 311'-313', and one or more further substrate portions may be attached to the filter frame 501 as desired by the customer.

In a third aspect of the invention, there is provided a method for manufacturing an optical measurement device 600—see FIG. 11 and the dashed rectangle 2 in FIG. 2—comprising an optical filter system 500, and an optical sensor system 602 comprising a plurality of optical sensors 605, 605', the method comprising the steps of:

providing the optical sensor system 602 (step 17 in FIG. 2), manufacturing the optical filter system 500 according to the method of the second aspect (block 1 in FIG. 2), aligning each optical sensor of the plurality of optical sensor 605, 605' with an optical filter of the plurality of optical filters 313, 313', 502-506 (step 18 in FIG. 2), and fastening the filter frame 500 relative to the sensor frame 602 such that the alignment is maintained and radiation impinging on each of the sensors must first have passed through the filter aligned with the impinged sensor (step 19 in FIG. 2).

The optical measurement device 600 is configured to obtain an optical measurement of light. By aligning an optical sensor with a filter, the optical sensor is configured, by the filter aligned with it, to generate a sensor signal representative of a property of the wavelengths that pass through the respective filter. For example, the optical sensor may be configured to generate a sensor signal representative of an intensity of the wavelengths that pass through the filter aligned with the sensor. For example, the optical sensor may be configured to generate a sensor signal representative of an intensity of a specific range of wavelengths. By aligning another sensor with another filter, the other optical sensor is configured, by the other filter, to generate a sensor signal representative of another specific wavelengths that pass through the other filter. For example, the other optical sensor may be configured to generate a sensor signal representative of an intensity of wavelengths that pass through the other filter. For example, the other optical sensor may be configured to generate a sensor signal representative of an intensity of the other range of wavelengths. For example, a first optical sensor and/or a second optical sensor both are a photodiode or phototransistor or any other type of sensor that changes an electrical resistance, an output voltage or an output current of in dependence of the intensity of the light incident on the optical sensor. For example, the optical sensors may be are arranged in a single package, optionally in a one-dimensional array or in a two-dimensional array.

By manufacturing the optical measurement device according to the third aspect, a cost-effective way of producing an optical measurement device is obtained. The filters, attached to a filter frame, are manufactured cost-effectively as described above, resulting in a cost-effective optical measurement device. The substrate portion are used as filter only when they have the desired filter properties. Substrate portions that do not have the desired filter properties for a certain optical measurement device are discarded or may find another use, for example, in another optical measurement device that has other specifications, for example, on another low-end optical measurement device or an optical measurement device with less resolution.

The effective way of manufacturing the optical measurement device becomes especially apparent in case the optical measurement device has a high resolution over a large range of wavelengths. For example, to match the high resolution of a high-end spectrometer over the range of visible light, 64 filters or more filters are desired, for example 256 filters. Creating a known optical filter system with this large number of filters would not be feasible, because statistically at least some of the filters would not be successfully created.

In a fourth aspect of the invention, there is provided an optical filter system 500 comprising a filter frame 501, and a plurality of filters 313, 313, 502-506 attached to the filter frame 501 in accordance with a filter array and each having a specific spectral sensitivity. Such a filter system with a frame having an array of filters may be manufactured and kept in stock, separate from the rest of an optical measurement device and may facilitate simplifying the manufacturing of the optical measurement device. The optical filter system according to the fourth aspect may, according to a further embodiment, have been manufactured with the method of the second aspect.

In a fifth aspect of the invention, there is provided an optical measurement device comprising an optical filter system 500 according to the fourth aspect of the invention, and an optical sensor system 602 comprising a plurality of optical sensors 605 provided on a sensor frame 606, the filter frame 501 and sensor frame 606 being different frames, the filter frame 501 carrying the filters 313, 313', 502-506 and the sensor frame 606 carrying the optical sensors 605; wherein each optical sensor of the plurality of optical sensors 605 is aligned with an optical filter of the plurality of optical filters 313, 313', 502-506; and wherein the filter frame 501 is fastened to the sensor frame 606 such that the alignment is maintained and radiation impinging on each of the optical sensors 605 must first have passed through the filter aligned with the impinged sensor.

In a sixth aspect of the invention, there is provided an optical measurement device comprising:
  a filter frame 501 provided with a filter array 500 of optical filters 520—like filters 313, 313', 502-506— attached to the filter frame 501, and
  a sensor frame 606 provided with a sensor array 602 of optical sensors 605 attached to the sensor frame 606, wherein the filter frame 501 and sensor frame 606 are different frames, the filter frame 501 carrying the optical filters 520; 313, 313', 502-506 and the sensor frame 606 carrying the optical sensors 605; wherein the sensor frame 606 is aligned with the filter frame 500 and attached to the filter frame 500 such that the alignment is maintained and each optical sensor of the plurality of optical sensors 605 is aligned with an optical filter of the plurality of optical filters 520; 313, 313', 502-506 to ensure that radiation impinging on each of the sensors 605 must first have passed through the filter aligned with the impinged sensor before being incident on this sensor. The number of optical sensors may equal the number of optical filter, but it is also very well conceivable that the number of sensors is larger than the number of optical filter, for example in case two or more optical sensors are aligned with the same optical filter.

In an embodiment of the fifth and/or sixth aspect, the sensors may comprise photodiodes sensitive for radiation in the range of 150-2500 nm, such as in the range of 100-1100 nm. In case the photodiodes are to measure visible light, a sensitivity for radiation in the range of at least 380-780 nm is required, but a photosensor sensitive for radiation in broader range, like in the range of 200-1100 may be used as well. In an additional or alternative embodiment of the fifth and/or sixth aspect, the optical sensor system may be a photodiode array, such as an 4×4 photodiode array, an 8×8 photodiode array, or an 16×16 photodiode array.

In an embodiment, the optical measurement device according to the fifth and/or sixth aspect, may be a colorimeter.

A colorimeter is an optical measurement device that is configured to measure color. The colorimeter generates an output signal that represents the measured color or colors. The output signal may represent the measured color(s) in chromaticity coordinates in red, green and blue. These chromaticity coordinates are typically referred to as tristimulus values X (red), Y (green) and Z (blue). By creating the filters-like the first filter 313, the second filter 313', and optionally additional filters—according to the invention, an accurate optical filter system 500 for the colorimeter is obtained. As a result, the colorimeter is able to perform high accuracy color measurements. Each of the filters is, for example, created to be passable by wavelengths in a desired range and at a desired transmittance. This way, the optical filter system 500 is optimized to take into account any filtering caused by other optical components in the colorimeter. This improves the accuracy of the colorimeter.

In a seventh aspect, the invention relates to use of the optical measurement device according to the fifth and/or sixth aspect for measuring a color or colors of an object. In a further embodiment the object may be a display iradiating the color/colors.

Displays of various devices, for example, mobile devices such as mobile phones and tablets, or monitors, such as tv monitors or computer monitors, display color when in use. In the production process of such a display, it is typical desired to measure the colors that the display irradiates to ensure that the irradiated colors match with a set of desired colors. For example, it is desired that all mobile phones of a certain type display the color blue in the same way, i.e., by irradiating the same wavelength or same wavelengths. By using the optical measurement device according to the embodiments above, the optical measurement device is able to accurately measure the colors irradiated by the display. The optical measurement device gives an output signal representative of the measured color. The output signal is, for example, compared with a reference signal that is representative of the desired color. In case the output signal deviates from the reference signal, for example, the display of the device may be adjusted. The output signal may for, for example, be representative of tristimulus values X (red), Y (green) and Z (blue).

Figure 3A:
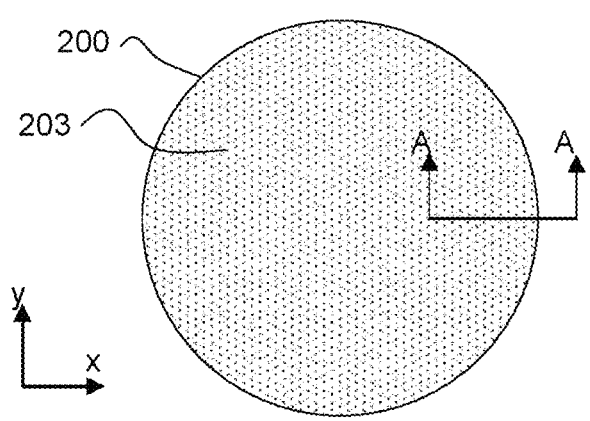
FIGS. 3A and 3B: the step of applying a first plurality of filter coatings on the first substrate according to the first and second aspect of the invention, respectively.
Figure 3B:
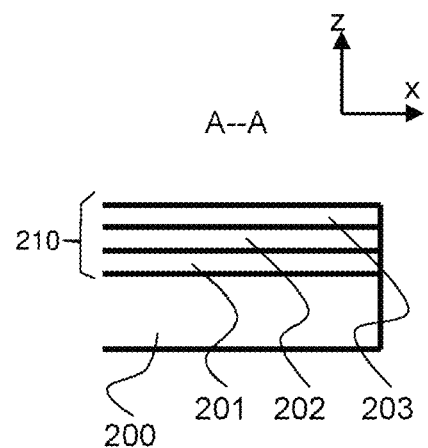

FIGS. 3A and 3B illustrate the step 11 of applying a first plurality of filter coatings 201-203 on the first substrate 200. FIG. 3A shows a top view of the coated first substrate 200. FIG. 3B shows a cross section of the coated first substrate 200 along line A-A.

The first substrate 200 is a substrate on which the first plurality of filter coatings 201-203 are applied. For example, the first substrate 200 may be a semiconductor wafer or a glass substrate. In the embodiment of FIG. 3A, the first substrate 200 has a disk shape. Alternatively, the first substrate 200 has any other suitable shape, such as square or rectangular or any other polygonal shape. The first substrate 200 may have a diameter of, for example, 20 mm or 30 mm or 50 mm or 100 mm or 200 mm or 300 mm. More in general, the diameter of the first substrate may be in the range of 20-30 mm to 300 mm. The diameter of the first substrate 200 extends along the xy-plane. The height of the first substrate 200 is, for example, less than 2 mm, for example less than 1 mm. Referring to the earlier mentioned dimensions of a diced, individual portion, the height of the first substrate 200, extending along the z-axis, may be in the range of 0.8 to 0.9 mm, and viewed in x-direction and y-direction—with the x-direction, y-direction, and z-direction being mutually orthogonal—the size in x-direction may be about 0.4 mm and the size in y-direction may be about 0.4 mm.

The first plurality of filter coatings forms a stack 200 comprising the the coatings 201-203 as layers of the stack, see the cross section A-A in FIG. 3B. In an embodiment, the first plurality of filter coatings 201-203 has more than 3 coatings 201-203, for example 10 coatings 201-203 or 20 tot 30 coatings 201-203 or 50 coatings 201-203 or more than 50 coatings 201-203, like about 70 coatings or more. The thickness, the density and the material of the coatings 201-203 are selected to achieve the desired filter properties. The thickness is, for example, selected to achieve destructive interference of some wavelengths passing through the filter, whereas the thickness is selected to achieve constructive interference of some other wavelengths passing through the filter.

The first plurality of filter coatings 201-203 are, for example, applied by sputter deposition, such as ion beam sputtering.

FIG. 4 illustrates the step 12 of dividing—the left side of FIG. 4—and the step 14 of dicing the first substrate 200 into a plurality of first substrate portions 311-314—the right side of FIG. 4—. After the first plurality of coatings 201-203 have been applied to the first substrate 200, the first substrate 200 is diced along the vertical lines 300 and along the horizontal lines 301. By dicing the first substrate 200, the first substrate 200 is separated into the plurality of first substrate portions 311-314. The first substrate portions 311-313 are illustrated with numbers 311-314.

FIG. 5 is a schematic view of the first substrate portions 311-313 and illustrates the step 13 of examining/determining. During step 11 of applying a first plurality of filter coatings 201-203 on the first substrate 200, a contamination 400 was unintentionally included between the coatings 201-203 of the first substrate portion 311. The contamination 400 may, for example, be a particle. The presence of the contamination 400 in the first substrate portion 311 causes that the first substrate portion 311 does not have the desired filter properties. For example, the first substrate portion 311 should allow wavelengths within a certain range to pass.

However, the substrate portion 311 reduces the intensity of the wavelengths within the range too much and/or allows wavelengths outside the certain range to pass as well. Because of this, the first substrate portion 311 is not labelled/selected as a good one to be used later as the first filter 313.

During step 11 of applying a first plurality of filter coatings 201-203 on the first substrate 200, the coating 202 and the coating 203 were not applied properly to the first substrate portion 312. As is shown in the figure, part of coating 202 is missing, creating a failed/defective coating 402. As a result of the failed/defective coating 402, the coating 203 locally has an increased thickness, which causes in turn a failed/defective coating 403. The presence of the failed/defective coatings 402 and 403 in the first substrate portion 312 causes that the first substrate portion 312 does not have the desired filter properties. For example, the first substrate portion 312 should allow wavelengths within a certain range to pass. However, the substrate portion 312 reduces the intensity of the wavelengths within the range too much and/or allows wavelengths outside the certain range to pass as well. Because of this, the first substrate portion 312 is not labelled/selected as a good one to be used later as the first filter 313.

As is shown in FIG. 5, the first substrate portion 313 has the coatings 201-203 properly applied. As a result, the first substrate portion 313 has the desired filter properties. The first substrate portion 313 is labelled/selected as a good one to be used later as the first filter 313.

For example, the first substrate portion 313 may undergo one or more manufacturing steps before the first substrate portion 313 is attached to the filter frame 501 as the first filter 313. For example, the first substrate portion 313 may be polished or provided with an outer coating. For example, the first substrate portion 313 may be grinded to accurately achieve an desired shape. For example, part of the first substrate 200 may be removed from the second substrate portion by grinding or etching.

The description above relating to FIGS. 3A, 3B, 4 and 5 describes the creation of the first filter 313. In a similar way, the second filter 313' is created as is shown in FIGS. 6A, 6B, 7 and 8. FIGS. 6A, 6B, 7 and 8 use the same reference numbers as in FIGS. 3A, 3B, 4 and 5, however now provided with quote sign, for example 200 in FIG. 3A became 200' in FIG. 6A.

Similar to what is shown in FIGS. 3A and 3B, FIGS. 6A and 6B illustrate that in the step 11 a second plurality of filter coatings 201'-203' is applied on the second substrate 200'.

The second substrate 200' is a substrate on which the second plurality of filter coatings 201'-203' are applied. For example, the second substrate 200' may be a semiconductor wafer or a glass substrate. The second substrate 200' has a disk shape, or any other suitable shape, such as square or rectangular or any other polygonic shape. The second substrate 200' may have a diameter of, for example, 20 mm or 30 mm or 50 mm or 100 mm or 200 mm or 300 mm. More in general, the diameter of the second substrate may be in the range of 20-30 mm to 300 mm. The second substrate 200' may be the same type of substrate as the first substrate 200, or may be a different type of substrate than the first substrate 200.

The thickness, the density and the material of the coatings 201'-203' on the second substrate 200' are selected to achieve the desired filter properties. The thickness is, for example, selected to achieve destructive interference of some wavelengths passing through the second filter 313', whereas the thickness is selected to achieve constructive interference of some other wavelengths passing through the second filter 313'.

The second plurality of filter coatings 201'-203' may, for example, be applied by sputter deposition, such as ion beam sputtering.

Similar to what is shown in FIG. 4, FIG. 8 illustrates that in the step 12 the second substrate 200' divided into substrate portions—see the left side of FIG. 8—and that in step 14 the second substrate is diced into a plurality of second substrate portions 311'-313'—see the right side of FIG. 8-. After the second plurality of coatings 201'-203' have been applied to the second substrate 200', the second substrate 200' is diced along vertical lines 300 and along horizontal lines 301. By dicing the second substrate 200', the second substrate 200' is separated into the plurality of second substrate portions 311'-313'.

Similar to what is shown in FIG. 5, FIG. 8 illustrates the step 13 of examining/determining for the second substrate portions. Some of the second substrate portions 311'-313' may have defects, such as the contamination 400 or the failed coatings 402, 403. Second substrate portions 311'-313' with defects are not labelled/selected as good ones. Some of the second substrate portions 311'-313' do not have defects, similar to first substrate portion 313. The second plurality of filter coatings 201'-203' are properly applied on the second substrate portion 313' without defects. The second substrate portion without defects are labelled/selected as good ones for later use as the second filter 313'.

The good one, second substrate portion 313' may undergo one or more manufacturing steps before the second substrate portion is attached to the second frame 501 as the second filter 313'. For example, the second substrate portion may be polished or may be provided with an outer coating. For example, the second substrate portion may be grinded to accurately achieve a desired shape. For example, part of the second substrate 200' may be removed from the second substrate portion by grinding or etching.

Similar as illustrated above in relation to the steps 11-14 for the first filter and second filter, applies to the steps 11-14 for the further filter(s).

Figure 9A:
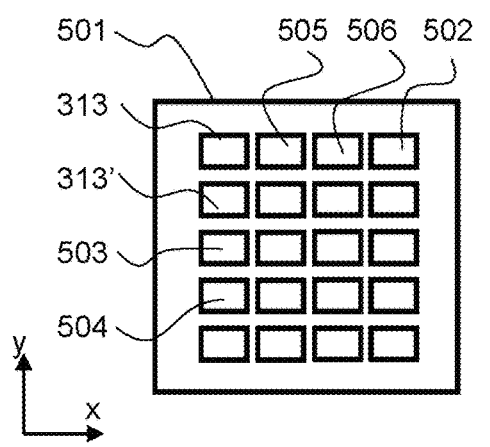
FIGS. 9A and 9B: an optical filter system according to a third aspect of the invention.
Figure 9B:
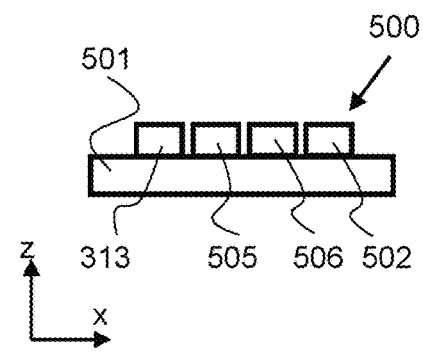
Figure 6A:
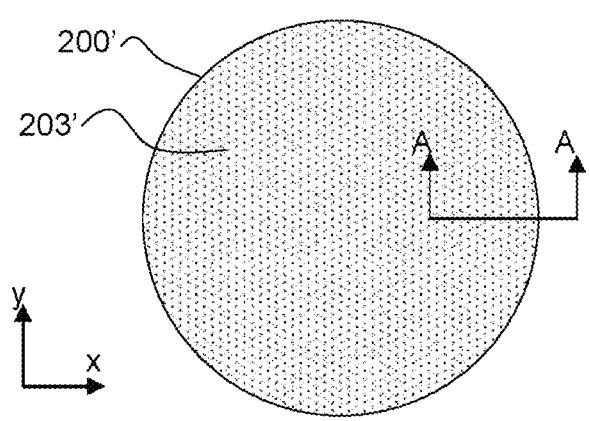
FIGS. 6A and 6B: the step of applying a second plurality of filter coatings on the second substrate according to the first and second aspect of the invention, respectively.
Figure 6B:
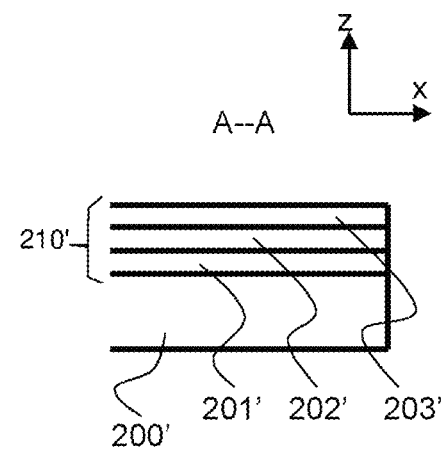

FIGS. 9A and 9B schematically show an optical filter system 500 according to an embodiment of the invention.

The optical filter system 500 comprises a filter frame 501 having attached to it: the first filter 313, the second filter 313' and additional filters 502-506. The filter frame 501 is in this example a transparent glass plate. The shape of the filter frame 501 is in this example rectangular as shown in FIG. 9A. The first filter 313, and the second filter 313', and further filters 502-506 are arranged on the top side of the filter frame 501, see FIG. 9B. In total, there are 20 filters arranged on the filter frame 501. The first filter 313, the second filter 313' and the additional filters are attached to the filter frame 501 in an array, in this example an in a 5×4 matrix.

Figure 10:
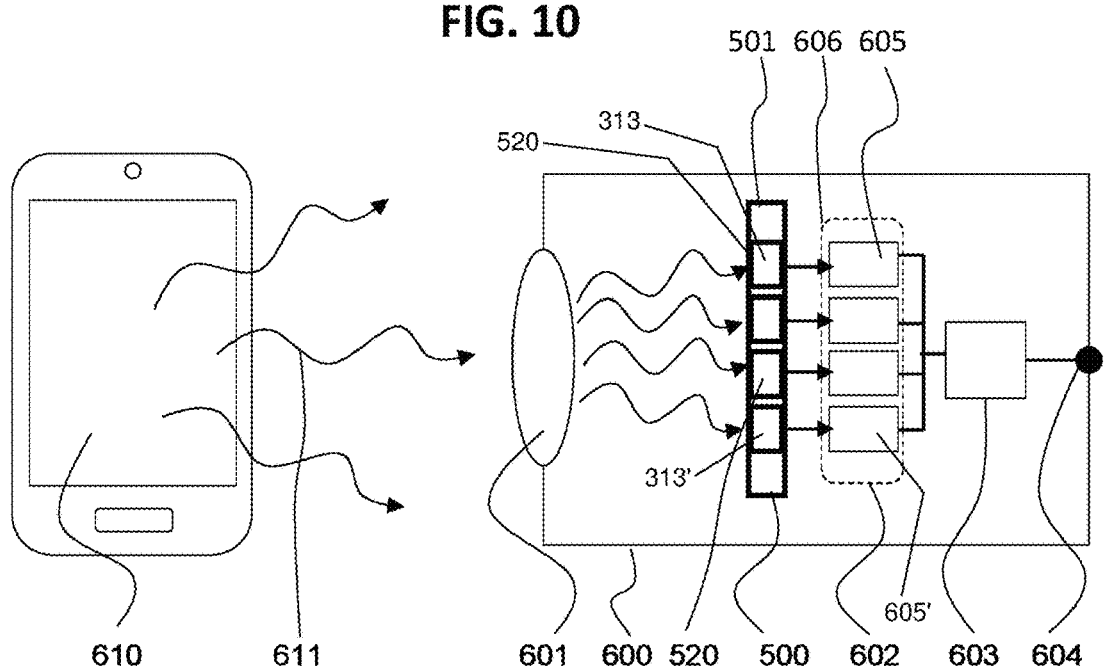
FIG. 10 depicts an optical measurement device according to a further aspect of the invention.

FIG. 10 depicts an optical measurement device according to an embodiment of the invention. For example, the optical measurement device is a colorimeter.

The optical measurement device 600 comprises a window 601 to receive light from an object 610. In this embodiment, the object 610 is a mobile phone device having a display. The display irradiates visible light with multiple colors. The display irradiates visible light and some of the light is incident on the window 601 as light 611. The window 601 allows the light to enter the optical measurement device 600. The optical measurement device further comprises:

an optical filter system 500 with an array 525 of filters 520 provided on a filter frame 501 according to any one of the embodiments mentioned above, a sensor array 602, a processing unit 603 and an output terminal 604.

The sensor array may comprise sensors 605 provided on a sensor frame 606.

The window receives the light from the object and allows this light to pass to the array of filters in the optical filter system 500. The array/plurality of filters include the first filter 313 and the second filter 313'. Optionally, the optical measurement device may comprises additional optical components arranged between the window and the optical filter system 500, for example, to guide the light to the optical filter system 500.

Depending on the filter properties of each filter, each filter allows passage of optical radiation in a range of specific wavelengths.

The sensor array 602 comprises a plurality of optical sensors 605. In this embodiment, the optical sensors are photodiodes. Each of the optical sensors 605 may be paired with one of the filters in the optical filter system 500. Each optical sensor may be aligned with a filter to receive the optical radiation in the range of wavelengths that passes the corresponding filter.

Each optical sensor generates a sensor signal based on the intensity of optical radiation that is incident on the optical sensor. Based on the color or colors irradiated by the display, some filters allow optical radiation to pass with a high intensity, whereas other filters allow optical radiation to pass only with a low intensity, or do not allow any optical radiation to pass. As a result, some optical sensors generate a sensor signal representative of a high intensity, whereas other optical sensors generate a sensor signal representative of a low intensity. The sensor signals are transmitted to the processing unit. The processing unit processes the sensor signals to generate an output signal representative of the color or colors of the display. The processing unit sends the output signal to the output terminal. For example, the output terminal is connectable to a device, such as a display, to indicate the measured color to the person operating the optical measurement device.

FIG. 11 depicts the filter properties of the optical filter system 500 according to the embodiment of FIGS. 9A and 9B.

Each filter in the optical filter system 500 provides relationship between the amount of optical radiation a filter allows to pass as a function of the wavelength. For some wavelengths, a filter may have a high transmittance, which means that a large amount or all of the optical radiation with these wavelengths pass through the filter. For other wavelengths, a filter may have a low transmittance, which means that only a small amount or no optical radiation with these wavelengths pass through the filter.

Each filter allows passage of a specific range of optical radiation which may be different from the specific range of other filters. Each range has a width 700, which is—in the example of FIG. 11—about 20 nm. Because each filter has a different range, all filters together cover a large portion of the visible light spectrum at a high resolution. Note that there is a gap 701 between the ranges 700. Because of the gaps 701, the optical measurement device is not sensitive to wavelengths that are in the gap 701, such as for example the wavelength of 570 nm. Depending on the application of the optical measurement device, it may be acceptable that the optical measurement device is not sensitive to some wavelengths. Alternatively, the range 700 may be broadened such that the gap 701 is reduced to zero or almost zero. For example, a range may overlap with one or two adjacent ranges.

By increasing the number of filters, or by limiting the measurement range of the optical measurement device, the range 700 may, for example become 5 nm or less, such as about 1 nm or less.

As shown in FIG. 11, the first filter 313 allows wavelengths between 390-410 nm to pass, but blocks all other wavelengths. The second filter 313' allows wavelengths between 410-430 nm to pass, but blocks all other wavelengths. Additional filter 502 allows wavelength between 430-450 nm to pass, but blocks all other wavelengths. Additional filter 503 allows wavelength between 450-470 nm to pass, but blocks all other wavelengths. Additional filter 504 allows wavelength between 470-490 nm to pass, but blocks all other wavelengths. Additional filter 505 allows wavelength between 490-510 nm to pass, but blocks all other wavelengths. And, additional filter 506 allows wavelength between 510-530 nm to pass, but blocks all other wavelengths.

In an embodiment, multiple filters are attached to the filter frame 501 that have the same range. For example, three additional filters 504 may be attached to the filter frame 501. to makes the optical measurement device more sensitive to wavelengths in the range of 470-490 nm.

Embodiments and further embodiments of the present invention—which (further) embodiments may be broader than claimed in the claims—may be expressed in words as set out in the following clauses:

Clause 1] Method for manufacturing filters for an optical filter system 500,
  wherein the method comprises the steps of:
    applying 11 a plurality of filter coatings 201-203 on a substrate 200 to obtain a coated substrate provided with a stack of filter coatings, which stack is designed for a specific spectral sensitivity of the respective filters to be manufactured,
    dividing 12 the coated substrate into a plurality of substrate portions,
    examining the coated substrate to determine 13 the good ones of the substrate portions, the good ones being the substrate portions where the coated substrate meets a predefined design requirement associated to the specific spectral sensitivity of the respective filter,
    after having determined the good ones, dicing 14 the coated substrate 200 into the plurality of substrate portions 311-313, and
    creating a stock of good ones of substrate portions.

Clause 2] Method for manufacturing an optical filter system 500,
  wherein the optical filter system 500 comprises:
    a plurality of filters 313, 313', each having a specific spectral sensitivity, and
    a filter frame 501 holding the plurality of filters in a predefined pattern; and
  wherein the method comprises, per said filter of a said specific spectral sensitivity, the steps of:
    applying 11 a plurality of filter coatings 201-203 on a substrate 200 to obtain a coated substrate provided with a stack of filter coatings, which stack is designed for the specific spectral sensitivity of the respective filter,
    dividing 12 the coated substrate into a plurality of substrate portions,
    determining 13 the good ones of the substrate portions, the good ones being the substrate portions where the coated substrate meets a predefined design requirement associated to the specific spectral sensitivity of the respective filter,
    dicing 14 the coated substrate 200 into the plurality of substrate portions 311-313, and
    picking 15 a said good one of the substrate portions as the filter;
  wherein the method further comprises a step of configuring 16 the filters picked and the filter frame such that the filter frame holds the plurality of filters in the predefined pattern.

Clause 3] Method according to clause 1 or clause 2, wherein, for one or more of the filters, the step of applying 11 the plurality of filter coatings 201-203 on the substrate 200 comprises applying 112, 121 one or more of the filter coatings by sputter deposition.

Clause 4] Method according to clause 3,
  wherein the sputter deposition comprises applying ion beam sputtering.

Clause 5] Method according to any one of the preceding clauses,
  wherein the specific spectral sensitivity for which the stack of a said respective filter is designed, is designed to allow passage of a specific range of optical radiation while blocking optical radiation outside the specific range.

Clause 6] Method according to clause 5,
  wherein the specific range of a first one of the respective filters is at least partly different from the specific range of another one of the respective filters.

Clause 7] Method according to clause 6,
  wherein the specific range of the first one of the respective filters includes a wavelength that is outside the specific range of the another one of the respective filters, and
  wherein the specific range of the another one of the respective filters includes a wavelength that is outside the specific range of the first one of the respective filters.

Clause 8] Method according to any one of the clause 5-7, wherein the specific range has a width of 10 nm or less, such as 5 nm or less or 2.5 nm or less or 1 nm or less.

Clause 9] Method according to any one of the preceding clauses,
  wherein the step of determining the good ones of the substrate portions comprises:
    measuring an optical filter property of the substrate portions 313, and
    identifying a said measured substrate portion as a said good one in case the measured optical filter property meets the predefined design requirement.

Clause 10] Method according to clause 9, wherein the optical filter property is representative of a range of wavelengths that are transmittable through the substrate portion 311-313.

Clause 11] Method according to any one of the preceding clauses,
  wherein the plurality of filters comprises at least 10 filters, such as 20 to 30 filters or more, for example 64 filters or more or 256 filters or more.

Clause 12] Method according to any one of the preceding clauses,
  wherein the plurality of filters, when attached to the filter frame, is arranged in a 1-dimensional or 2-dimensional array.

Clause 13] Method according to any one of the preceding clauses,
comprising a step of manufacturing one or more further optical filter systems,
wherein each further optical filter system comprises:
a further plurality of filters, each filter having a said specific spectral sensitivity, and
a further filter frame holding the further plurality of filters in a predefined pattern; and
wherein the step of manufacturing the one or more further optical filter systems comprises, per further optical filter system, the steps of:
picking, per said filter of a said specific spectral sensitivity, a said good one of the substrate portions as the filter and
configuring the filters picked and the further filter frame such that the further filter frame holds the further plurality of filters in the predefined pattern.

Clause 14] Method according to any one of the preceding clauses,
wherein the optical filter system manufactured is a filter system of a colorimeter.

Clause 15] Method according to any one of the preceding clauses, wherein one or more of the filters have a specific spectral sensitivity different from the spectral sensitivities of other of the filters.

Clause 16] Method for manufacturing an optical measurement device 600 comprising an optical filter system 500 and an optical sensor system comprising a plurality of optical sensors provided on a sensor frame,
the method comprising the steps of:
providing 17 the optical sensor system,
manufacturing 1 the optical filter system 500 according to the method of any one of the preceding clauses,
aligning 18 each optical sensor of the plurality of optical sensors with a said optical filter of the plurality of filters, and
fastening 19 the filter frame relative to the sensor frame such that the alignment is maintained and radiation impinging on each of the sensors must first have passed through the filter aligned with the impinged sensor.

Clause 17] Method according to clause 16,
wherein the plurality of filters consist of an X number of filters, wherein the plurality of sensors consist of an Y number of sensors, and wherein Y≥X.

Clause 18] Method according to any one of clauses 16-17,
wherein the sensors comprise photodiodes sensitive for radiation in the range of 150-2500 nm, such as in the range of 200-1100.

Clause 19] Method according to any one of clauses 16-18,
wherein the sensors of the provided optical sensor system are attached to a sensor frame in a predefined sensor array,
wherein, in the step of configuring, the filters are arranged according to a filter array configured to have same dimensions as the predefined sensor array, and
wherein the step of 'aligning each optical sensor of the plurality of optical sensors with a said optical filter of the plurality of filters', comprises aligning the sensor frame with the filter frame.

Clause 20] Method according to any one of the clauses 16-19,
wherein the optical measurement device manufactured is a colorimeter.

Clause 20] Optical filter system 500,
wherein the optical filter comprises:
a filter frame 501, and
a plurality of filters attached to the filter frame 501 in accordance with a filter array and each having a specific spectral sensitivity.

Clause 22] Optical filter system according to clause 21,
wherein the optical filter system has been manufactured according to the method of any one of clauses 1-15.

Clause 23] Optical filter system according to any one of the clauses 21-22,
wherein the filter coatings have been applied by sputter deposition, such as ion beam sputtering.

Clause 24] Optical filter system according to any one of the clauses 21-23,
wherein the specific spectral sensitivity of a said filter is configured to allow passage of a specific range of optical radiation while blocking optical radiation outside the specific range.

Clause 25] Optical filter system according to clause 24,
wherein the specific range of a first one of the filters is at least partly different from the specific range of another one of the filters.

Clause 26] Optical filter system according to clause 25,
wherein the specific range of the first one of the filters includes a wavelength that is outside the specific range of the another one of the filters, and
wherein the specific range of the another one of the filters includes a wavelength that is outside the specific range of the first one of the filters.

Clause 27] Optical filter system according to any one of the clauses 21-26,
wherein the specific range has a width of 10 nm or less, such as 5 nm or less or 2.5 nm or less or 1 nm or less.

Clause 28] Optical filter system according to any one of the clauses 21-27,
wherein the plurality of filters comprises at least 10 filters, such as 20 to 30 filters or more, for example 64 filters or more or 256 filters or more.

Clause 29] Optical filter system according to any one of the clauses 21-28,
wherein the plurality of filters is attached to the filter frame in a 1-dimensional or 2-dimensional array.

Clause 30] Method according to any one of the clauses 21-29, wherein one or more filters have a specific spectral sensitivity different from the spectral sensitivities of other filters.

Clause 31] Optical measurement device 600,
wherein the optical measurement device comprises:
an optical filter system 500 according to any of clauses 21-30, and
an optical sensor system comprising a plurality of optical sensors provided on a sensor frame;
wherein the filter frame and sensor frame are different frames, the filter frame carrying the filters and the sensor frame carrying the sensors;
wherein each optical sensor of the plurality of optical sensors is aligned with an optical filter of the plurality of optical filters; and
wherein the filter frame is fastened to the sensor frame such that the alignment is maintained and radiation impinging on each of the sensors must first have passed through the filter aligned with the impinged sensor.

Clause 32] Optical measurement device,
the optical measurement device comprising:
a filter frame provided with a filter array of optical filters attached to the filter frame, and
a sensor frame provided with a sensor array of optical sensors attached to the sensor frame, wherein the filter array and sensor array have same dimensions, wherein the filter frame and sensor frame are different frames, the filter frame carrying the optical filters and the sensor frame carrying the optical sensors;

wherein the sensor frame is aligned with the filter frame and attached to the filter frame such that the alignment is maintained and each optical sensor of the plurality of optical sensors is aligned with an optical filter of the plurality of optical filters to ensure that radiation impinging on each of the sensors must first have passed through the filter aligned with the impinged sensor.

Clause 33] Optical measurement device according to any of clauses 31-32, wherein the sensors comprise photodiodes sensitive for radiation in the range of 150-2500, such as in the range of 200-1100 nm.

Clause 34] Method according to any of clauses 31-33, wherein the plurality of filters consist of an X number of filters, wherein the plurality of sensors consist of an Y number of sensors, and wherein Y≥X.

Clause 35] Optical measurement device according to any of clauses 31-34, wherein the plurality of sensors comprises at least 10 sensors, such as 20 to 30 sensors or more, for example 64 sensors or more or 256 sensors or more.

Clause 36] Optical measurement device according to any of clauses 31-35, wherein the plurality of sensors is attached to the sensor frame in a 1-dimensional or 2-dimensional array.

Clause 37] Optical measurement device according to any of clauses 31-36, wherein the optical sensor system is a photodiode array.

Clause 38] Optical measurement device according to clause 37, wherein the photodiode array is one of: an 4×4 photodiode array, an 8×8 photodiode array, or an 16×16 photodiode array.

Clause 39] Optical measurement device 600 according any of clauses 31-38, wherein the optical measurement device 600 is a colorimeter.

Clause 40] Use of the optical measurement device 600 according to any of the clauses 31-39 for measuring a color/colors of an object.

Clause 41] Use according to clause 40, wherein the object is a display 610 irradiating the color/colors.

This document schematically describes detailed embodiments of the invention. However it must be understood that the disclosed embodiments serve exclusively as examples, and that the invention may be implemented in other forms.

The invention claimed is:

1. Method for manufacturing filters for an optical filter system, wherein the optical filter system comprises: i) a plurality of filters, each having a specific spectral sensitivity, and ii) a filter frame holding the plurality of filters in a predefined pattern;

and wherein the method comprises, per said filter of a said specific spectral sensitivity, the steps of:

applying a plurality of filter coatings on a substrate to obtain a coated substrate provided with a stack of filter coatings, which stack is designed for the specific spectral sensitivity of the respective filter, dividing the coated substrate into a plurality of substrate portions, examining the coated substrate to determine the good ones of the substrate portions, the good ones being the substrate portions where the coated substrate meets a predefined design requirement associated to the specific spectral sensitivity-of the respective filter, after having determined the good ones, dicing the coated substrate into the plurality of substrate portions, and creating a stock of the good ones of diced substrate portions by discarding the diced substrate portions which do not meet the predefined design requirement.

2. Method for manufacturing an optical filter system, wherein the optical filter system comprises: i) a plurality of filters, each having a specific spectral sensitivity, and ii) a filter frame holding the plurality of filters in a predefined pattern; and wherein the method comprises:

the steps of the claim 1 executed at one moment in time, and, executed at a later moment in time and per said filter of a said specific spectral sensitivity, the step of picking a said good one of the substrate portions as the filter from a said stock comprising filters of the said spectral sensitivity; and a step of configuring the filters picked and the filter frame such that the filter frame holds the plurality of filters in the predefined pattern.

3. Method for manufacturing an optical filter system, wherein the optical filter system comprises: i) a plurality of filters, each having a specific spectral sensitivity, and ii) a filter frame holding the plurality of filters in a predefined pattern;

and wherein the method comprises, per said filter of a said specific spectral sensitivity, the steps of:

applying a plurality of filter coatings on a substrate to obtain a coated substrate provided with a stack of filter coatings, which stack is designed for the specific spectral sensitivity of the respective filter, dividing the coated substrate into a plurality of substrate portions, examining the coated substrate to determine the good ones of the substrate portions, the good ones being the substrate portions where the coated substrate meets a predefined design requirement associated to the specific spectral sensitivity-of the respective filter, after having determined the good ones, dicing the coated substrate into the plurality of substrate portions, and picking a said good one of the substrate portions as the filter wherein the method further comprises a step of configuring the filters picked and the filter frame such that the filter frame holds the plurality of filters in the predefined pattern.

4. Method according to claim claim 1, wherein, for one or more of the filters, the step of applying the plurality of filter coatings on the substrate comprises applying one or more of the filter coatings by sputter deposition.

5. Method according to claim 4, wherein the sputter deposition comprises applying ion beam sputtering.

6. Method according to claim 1, wherein the specific spectral sensitivity for which the stack of a said respective filter is designed, is designed to allow passage of a specific range of optical radiation while blocking optical radiation outside the specific range.

7. Method according to claim 6,
wherein the specific range of a first one of the respective filters is at least partly different from the specific range of another one of the respective filters.

8. Method according to claim 7,
wherein the specific range of the first one of the respective filters includes a wavelength that is outside the specific range of the another one of the respective filters, and
wherein the specific range of the another one of the respective filters includes a wavelength that is outside the specific range of the first one of the respective filters.

9. Method according to claim 6, wherein the specific range has a width of 10 nm or less, such as 5 nm or less or 2.5 nm or less or 1 nm or less.

10. Method according to claim 1, wherein the step of examining to determine the good ones of the substrate portions comprises:
measuring an optical filter property of the substrate portions, and
identifying a said measured substrate portion as a said good one in case the measured optical filter property meets the predefined design requirement.

11. Method according to claim 10, wherein the optical filter property is representative of a range of wavelengths that are transmittable through the substrate portion.

12. Method according to claim 1, wherein the plurality of filters comprises at least 10 filters, such as 20 to 30 filters or more, for example 64 filters or more or 256 filters or more.

13. Method according to claim 1, wherein the plurality of filters, when attached to the filter frame, is arranged in a 1-dimensional or 2-dimensional array.

14. Method according to claim 2,
comprising a step of manufacturing one or more further optical filter systems,
wherein each further optical filter system comprises:
a further plurality of filters, each filter having a said specific spectral sensitivity, and
a further filter frame holding the further plurality of filters in a predefined pattern; and
wherein the step of manufacturing the one or more further optical filter systems comprises, per further optical filter system, the steps of:
picking, per said filter of a said specific spectral sensitivity, a said good one of the substrate portions as the filter and
configuring the filters picked and the further filter frame such that the further filter frame holds the further plurality of filters in the predefined pattern.

15. Method according to claim 1, wherein the optical filter system manufactured is a filter system of a colorimeter.

16. Method according to claim 1, wherein one or more of the filters have a specific spectral sensitivity different from the spectral sensitivities of other of the filters.

* * * * *